United States Patent [19]
Hamada et al.

[11] Patent Number: 5,644,124
[45] Date of Patent: Jul. 1, 1997

[54] PHOTODETECTOR WITH A MULTILAYER FILTER AND METHOD OF PRODUCING THE SAME

[75] Inventors: Toshimasa Hamada, Yamatokooriyama; Masaru Iwasaki, Izumisano; Tetsuya Hanamoto, Nishinomiya; Shohichi Katoh, Yamatotakada; Takahiro Funakoshi, Tenri; Koji Miyake, Higashi-Hiroshima; Masumi Nakamichi, Tenri, all of Japan

[73] Assignee: Sharp Kabushiki Kaisha, Osaka, Japan

[21] Appl. No.: 646,729

[22] Filed: May 1, 1996

Related U.S. Application Data

[63] Continuation of Ser. No. 270,165, Jul. 1, 1994, abandoned.

[30] Foreign Application Priority Data

Jul. 1, 1993 [JP] Japan .................................. 5-163522

[51] Int. Cl.$^6$ .................................................. H01J 3/14
[52] U.S. Cl. .................. 250/216; 250/226; 359/359; 257/464
[58] Field of Search .................. 250/216, 226, 250/214 R, 214.1, 208.1; 359/586–589, 359; 257/443, 444, 433, 434, 461, 464

[56] References Cited

U.S. PATENT DOCUMENTS

| | | | |
|---|---|---|---|
| 3,996,461 | 12/1976 | Sulzbach et al. | 250/214 R |
| 4,827,118 | 5/1989 | Shibata et al. | 250/226 |
| 4,925,259 | 5/1990 | Emmett | 359/359 |
| 5,144,498 | 9/1992 | Vincent | 250/226 |
| 5,272,332 | 12/1993 | Ning | 250/226 |

FOREIGN PATENT DOCUMENTS

| | | |
|---|---|---|
| 0487209 | 5/1992 | European Pat. Off. . |
| 50-68787 | 6/1975 | Japan . |
| 1-188806 | 7/1989 | Japan . |
| 2-7589 | 1/1990 | Japan . |
| 6-77507 | 3/1994 | Japan . |

OTHER PUBLICATIONS

Patent Abstracts of Japan, vol. 12, No. 406, (P-777) (27 Oct. 1988) corresponding to Japanese Patent Publication No. 63-144306 (Jun. 16, 1988).
Patent Abstracts of Japan, vol. 11, No. 285, (P-616) (16 Sep. 1987) corresponding to Japanese Patent Publication No. 62-081605 (Apr. 15, 1987).
Patent Abstracts of Japan, vol. 10, No. 38, (P-428) (14 Feb. 1986) corresponding to Japanese Patent Publication No. 60-185901 (Sep. 21, 1985).
Patent Abstracts of Japan, vol. 9, No. 299, (P-408) (27 Nov. 1985) corresponding to Japanese Patent Publication No. 60-134203 (Jul. 17, 1985).
Patent Abstract of Japan, vol. 16, No. 392, (E-1251) (20 Aug. 1992) corresponding to Japanese Patent Publication No. 04-129269 (Apr. 30, 1992).
Patent Abstracts of Japan, vol. 14, No. 437, (E-980) (19 Sep. 1990) corresponding to Japanese Patent Publication No. 02-170575 (Jul. 2, 1990).

Primary Examiner—Que Le
Attorney, Agent, or Firm—Morrison & Foerster LLP

[57] ABSTRACT

Disclosed is a photodetector with a multilayer filter. A light-receiving substrate is mounted on a recessed portion of a ceramic stem. An electrode pad is formed on a P-type layer of the light-receiving substrate while another electrode pad is formed on an N-type layer of the light-receiving substrate. An optical multilayer filter is formed on the light-receiving substrate except the regions of the electrode pads. Further, an epoxy transparent resin is poured into the recessed portion of the stem and then cured, so that a resin portion to cover the light-receiving substrate is formed. The optical multilayer filter is formed of amorphous low refractive index films made of $SiC_2$ and amorphous high refractive index films made of $TiO_2$. The amorphous high and low refractive index films are alternately stacked.

28 Claims, 16 Drawing Sheets

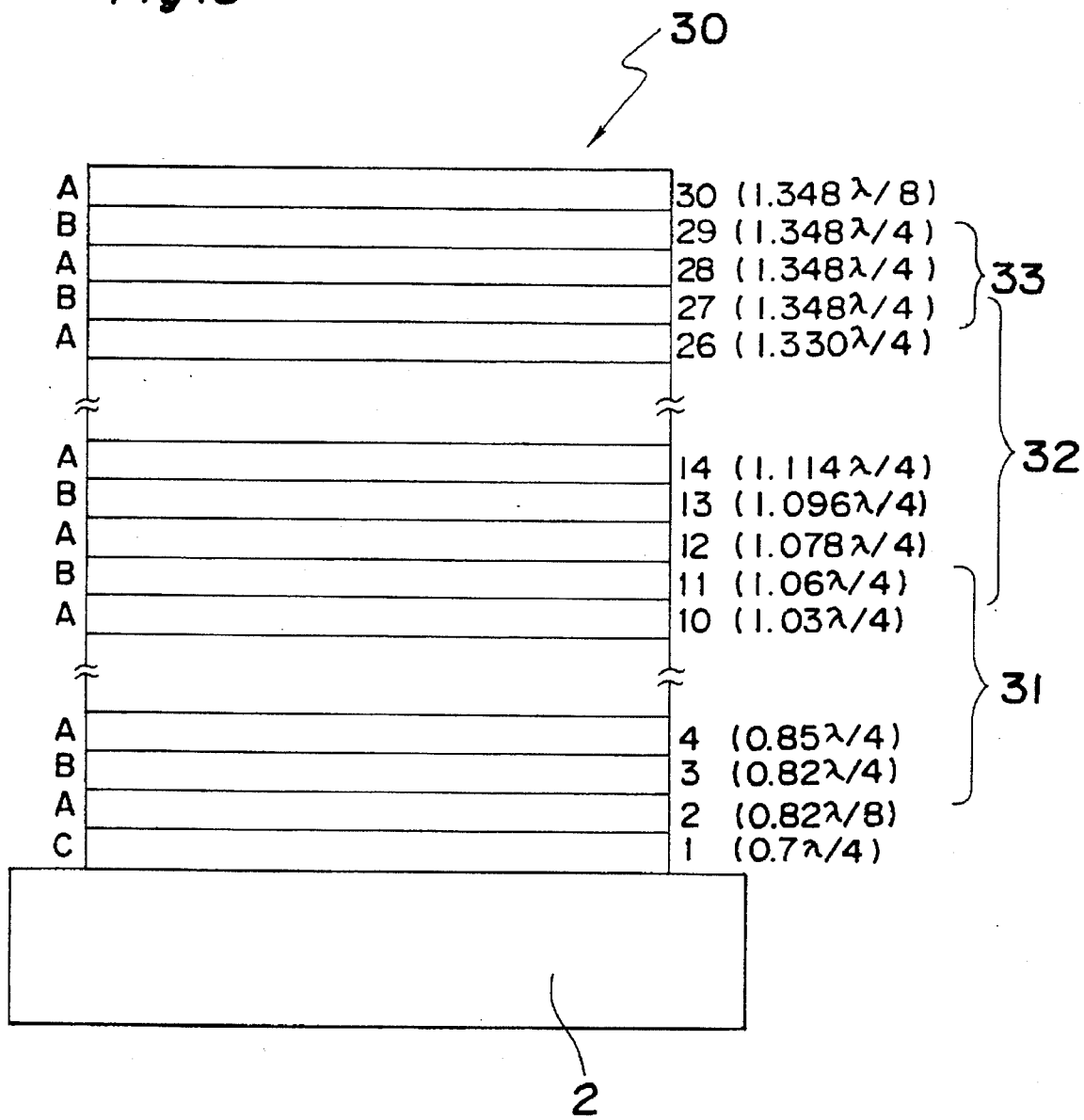

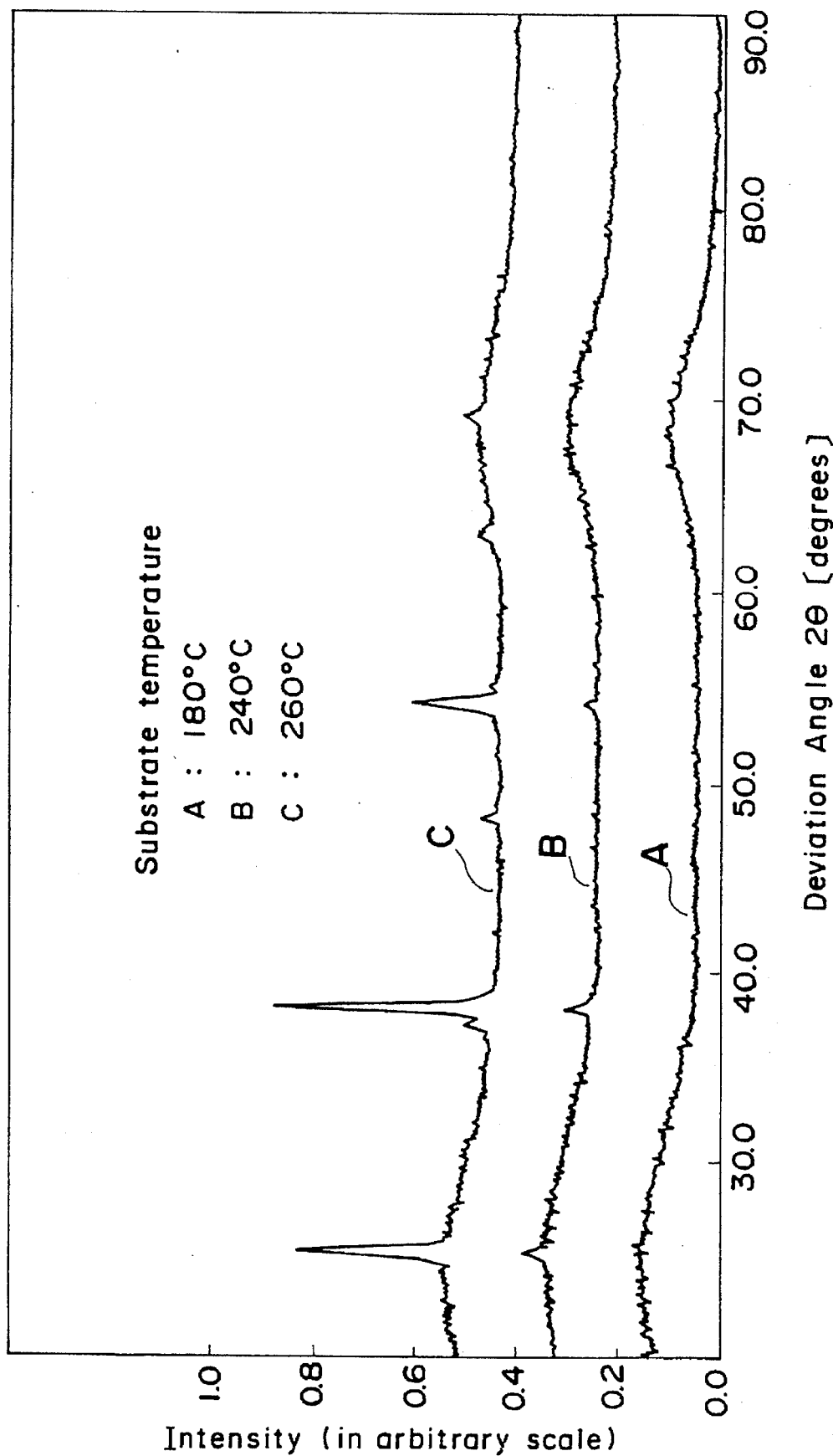

PHOTODETECTOR WITH A MULTILAYER FILTER AND METHOD OF PRODUCING THE SAME

This application is a continuation application Ser. No. 08/270,165, filed Jul. 1, 1994, now abandoned.

BACKGROUND OF THE INVENTION

The present invention relates to a photodetector with a multilayer filter, for use in automatic exposure systems for cameras or the like.

FIG. 20 shows a silicon (Si) photodiode conventionally used as a photodetector with a visual sensitivity correction filter for use in automatic exposure systems for cameras. This Si photodiode has the following construction. A light-receiving substrate 2 is mounted on a recessed portion 1a provided in a ceramic stem 1. A transparent resin is poured into the recessed portion 1a of the stem 1 and then allowed to cure, so that a resin portion 3 with which the light-receiving substrate 2 is covered is formed. A glass absorption filter 10 is attached onto the resin portion 3. Two metallic lead pins 6 are secured through the bottom of the stem 1. Wires made of Au are connected from the metallic lead pins 6 to electrode pads 4, 5 formed on the light-receiving substrate 2. The glass absorption filter 10 is provided with characteristics such as infrared rays cutoff, so that the spectral sensitivity characteristic of the Si photodiode matches the visual sensitivity. Thus, it has been made possible to measure quantity of light in man's visible region during automatic exposure of a camera.

FIG. 21 shows the optical transmittance characteristic of the glass absorption filter 10. For the Si photodiode to be improved in the photo detection sensitivity, the optical transmittance of the glass absorption filter 10 is desirably close to 100%. However, the optical transmittance curve of the glass absorption filter 10 used for the Si photodiode shows a maximum transmittance in the optical transmittance bands of about 80% at the most, as shown in FIG. 21. Therefore, it is difficult to obtain a high photo-detection sensitivity with the glass absorption filter 10. Further, the glass absorption filter 10 has difficulty in design change because its characteristics depend on coloring materials. Accordingly, there is a problem that the spectral sensitivity characteristic of the Si photodiode cannot be easily changed by changing the characteristics of the glass absorption filter 10. In addition, the glass absorption filter 10 is likely to be misted due to moisture in the air or the like, so that there is a question about its reliability.

As a solution for such problems, two of the inventors of the present application have recently designed a photodetector with a multilayer filter which is formed directly on the surface of the light-receiving substrate for the visual sensitivity correction (Japanese Patent Laid-open publication No. 6-77507, issued Mar. 18, 1994). The publication was issued after Applicant's priority date.

FIG. 22 shows a sectional view of the proposed photodetector with a multilayer filter. In FIG. 22, components similar to those of the above-mentioned Si photodiode are designated by the same reference numerals as those used in FIG. 20. In this photodetector with a multilayer filter, instead of the glass absorption filter 10 of the Si photodiode as shown in FIG. 20, an optical multilayer film 20 is formed on the light-receiving substrate 2. The optical multilayer film 20 serves as a filter for adjusting the spectral sensitivity characteristic of the photodetector to the visual sensitivity. Also, the optical multilayer film 20 is formed by alternately laminating low refractive index films made of $SiO_2$ films and high refractive index films made of $TiO_2$. These low and high refractive index films are formed directly on the light-receiving substrate 2 by electron-beam deposition or the like.

In order that the films made of $TiO_2$ have a high refractive index, $TiO_2$ is deposited on the light-receiving substrate 2 while the light-receiving substrate 2 is kept at a temperature of about 300° C., in usual cases. Then, after the formation of the optical multilayer film 20, parts of the multilayer film on the electrode pads 4, 5 are removed. In this process, because the high refractive index films made of $TiO_2$ deposited on the light-receiving substrate 2 having a temperature of around 300° C. have been partially crystallized, it would be difficult to remove the multilayer film by wet etching. Therefore, the multilayer film on the electrode pads 4, 5 is removed by a dry etching process such as plasma etching or ion beam etching. The photodetector, which employs the above optical multilayer films 20, is prevented from being misted in the optical multilayer film 20 by humidity and thus free from deterioration in characteristics. Also, since the optical multilayer film 20 serves as a protective film for the light-receiving substrate 2, the photodetector can be prevented from deterioration in characteristics, with its reliability improved.

Unfortunately, the removal of the multilayer film on the electrode pads 4, 5 by dry etching would result in a higher cost than by wet etching. Furthermore, semiconductor crystals of the light-receiving substrate 2 are exposed to ion beams and therefore likely to be damaged.

FIG. 23 shows a sectional view of the light-receiving substrate 2 of the photodetector of FIG. 22. A guard ring electrode 7 is formed on the boundary between a P-type layer 2a and an N-type layer 2b of the light-receiving substrate 2. The guard ring electrode 7, which is formed simultaneously with the electrode pads (not shown in FIG. 23), has such a large degree of surface roughness that the guard ring electrode 7 could not be enough planarized by even laminating a passivation film or a multilayer film thereon. For this reason, part of light 21 incident on the light-receiving substrate 2 strikes the guard ring electrode 7, resulting in scattered light 22. Part of the scattered light 22 becomes light 23 that propagates in the optical multilayer film 20. Then, part of the light 23 reaches an end face 2c of the light-receiving substrate 2 and is scattered there, resulting in scattered light 25. Part of the scattered light 25 enters inside through the end face 2c of the light-receiving substrate 2, whereby light components of undesired wavelengths are received. Meanwhile, another part of the light 23 that propagates in the optical multilayer films 20 is absorbed by the light-receiving substrate 2 during its propagation as indicated by light 24. Further, part of the light incident on the light-receiving substrate 2, although not shown, directly reaches the end face 2c of the light-receiving substrate 2. Such light 24, scattered light 25, and the light that comes directly incident on the end face 2c of the light-receiving substrate 2 may cause the photodetector to deteriorate in its spectral sensitivity characteristic, disadvantageously.

SUMMARY OF THE INVENTION

The present invention has been developed with a view to substantially solving the above described disadvantages and has for its essential object to provide a photodetector with a multilayer filter which can be patterned by wet etching.

Another object of the present invention is to provide a photodetector with multilayer filter which prevents unnecessary light from becoming incident on any region except the light-receiving portion, and which is fabricated at low cost and has a good spectral sensitivity characteristic.

In order to achieve the aforementioned objects, the present invention provides a photodetector, comprising:

a light-receiving substrate having a light receiving portion on a top surface of the substrate and performing photoelectric conversion to light received by the light-receiving portion; and a multilayer filter formed on the light-receiving substrate for selectively passing light components in a predetermined wavelength band, wherein the multilayer filter comprises high refractive index films and low refractive index films and wherein at least ones of the high refractive index films and the low refractive index films are amorphous.

The multilayer filter composed of the high refractive index films and the low refractive index films is not misted by humidity. Thus, the photodetector of the invention can be prevented from deterioration in characteristics. Further, the multilayer filter serves as a protective film for the light-receiving substrate, so that the photodetector is improved in reliability.

Generally, individual light-receiving substrates are obtained by forming a plurality of light-receiving IS substrates in a wafer and then dividing the wafer into the individual light-receiving substrates. According to the present invention, the multilayer filter can be formed at the same time for all the light-receiving substrates on the wafer before the wafer is divided. The work of mounting a glass absorption filter for each light-receiving substrate is not required any more. Thus, the cost involved can be reduced. Moreover, at least ones of the high refractive index films and the low refractive index films, which constitute the multilayer filer, are amorphous, so that the multilayer filter can be easily processed or patterned by wet etching. As an etchant, a mixed solution of hydrofluoric acid and sulfuric acid can be used.

Because the wet etching can be used for the patterning of the multilayer filter, the productivity is improved and the cost can be reduced, as compared with the dry etching such as the ion beam etching or the plasma etching. Further, since ion beams are not used, the light-receiving substrate can be prevented from being damaged by ion beams, so that the reliability is improved.

In an embodiment of the present invention, the multilayer filter is formed at a temperature of the light-receiving substrate lower than a temperature that causes the said at least ones of the high refractive index films and the low refractive index films to be crystallized. Therefore, controlling the temperature of the light-receiving substrate allows an easy formation of the amorphous films.

Preferably, both the low refractive index films and the high refractive index films are amorphous, so that wet etching operation for the multilayer filter becomes more easy.

In an embodiment, the high refractive index films are formed of $TiO_2$ and the low refractive index films are formed of $SiO_2$.

When the high refractive index films are formed of $TiO_2$, the temperature of the light-receiving substrate at the time of formation of the multilayer filter is set at 240° C. or lower to make the $TiO_2$ films amorphous.

In an embodiment of the invention, the photodetector further comprises a non-transmissive film that does not pass light, the non-transmissive film being formed on the multilayer filter in regions other than a region corresponding to the light-receiving portion of the light-receiving substrate. With this arrangement, unnecessary light incident on the regions coated with the non-transmissive film can be eliminated by being reflected or absorbed by the non-transmissive film, so that the photodetector can be prevented from deterioration in the spectral sensitivity characteristic due to the unnecessary light. A metal reflective film may be used as the non-transmissive film.

In an embodiment of the invention, the photodetector further comprises an opaque resin portion that covers side surfaces of the light-receiving substrate. Instead of the opaque resin portion, a metal reflective film can be formed to cover the side surfaces of the light-receiving substrate. With this arrangement, light incident on the side surface of the light-receiving substrate is absorbed or reflected by the opaque resin or the metal reflective film, so that unnecessary light will not be received by the light-receiving substrate. Thus, the photodetector can be prevented from deterioration in spectral sensitivity characteristic. Further, when the rear surface of the light-receiving substrate is also coated with an opaque resin or a metal reflective film, light incident on the rear surface of the light-receiving substrate is also prevented from entering inside the light-receiving substrate by the opaque resin or the metal reflective film.

In a further embodiment of the invention, the photodetector further comprises a $P^+$ layer of a specified P-type impurity concentration that is formed in a peripheral portion of the top surface of the light-receiving substrate; and an $N^+$ layer of a specified N-type impurity concentration that is formed immediately inside the $P^+$ layer. The $P^+$ layer and $N^+$ layer constitute PN junction. With this arrangement, carriers generated by the light incident on the side surfaces of the light-receiving substrate are absorbed by the $P^+$ layer and the $N^+$ layer of PN junction, so that generation of photocurrents caused by the unnecessary light can be suppressed. As a result, even if unnecessary light enters the side surfaces of the light-receiving substrate, there will not be generated photocurrents, so that the photodetector can be prevented from deterioration in spectral sensitivity characteristic.

Preferably, the light-receiving substrate with the multilayer filter is entirely sealed with a transparent resin, because the light-receiving substrate can be prevented from deterioration due to humidity or the like. The multilayer filter and the light-receiving substrate are protected by the transparent resin.

In an embodiment of the invention, the uppermost-layer film of the multilayer filter in contact with the transparent resin is a low refractive index film. Thus, matching between the multilayer filter and the transparent resin can be obtained, so that a good spectral sensitivity characteristic can be obtained.

In an embodiment of the invention, the high and low refractive index films of the multilayer filter have optical film thicknesses that form a plurality of different types of arithmetic series, the arithmetic series of one type being different in common difference from the arithmetic series of another type. Thus, the layers corresponding to the respective arithmetic series have different transmission bands. The transmission bands in combination determine the filter characteristics of the multilayer filter. Accordingly by setting the optical film thicknesses of the films of the multilayer filter appropriately, the spectral sensitivity characteristic of the photodetector can be arbitrarily set.

When the filter characteristic of the multilayer film is adjusted so as to have a spectral sensitivity characteristic substantially equal to visual sensitivity, the photodetector can be used in apparatuses requiring an accurate measurement of light quantity in a wavelength region visible to man.

The photodetector according to the present invention can be used in various apparatuses such as an automatic exposure system for a camera, a color discrimination system, an optical spatial transmission system, an optical wavelength-multiplexing spatial transmission system, etc.

When the present invention is applied to an automatic exposure system for a camera, the multilayer filer is designed to provide a spectral sensitivity characteristic necessary for measurement of quantity of light. Due to the advantages of the photodetector of the invention, the automatic exposure system can be produced at low costs and can accurately measure quantity of light.

When the present invention is applied to a color discrimination system, three photodetectors are used and their respective multilayer filters are designed to transmit light components of the three primary colors, blue, green, and red, respectively. Due to the advantages of the photodetectors of the invention, the system can correctly discriminate colors of incident light, i.e. of an object through comparison of outputs of the three photodetectors.

When the present invention is applied to an optical spatial transmission system, the spectral sensitivity characteristic of the photodetector is adjusted to a specified narrow band, and the specified narrow band is made as close as the light-emitting wavelength band on the transmission side. Thus, light components of other wavelength bands can be eliminated, whereby any deterioration in transmission characteristics due to unnecessary light can be prevented. As a result, there can be provided an optical spatial transmission system having good transmission characteristics.

When a plurality of photodetectors of the invention are used in an optical wavelength-multiplexing spatial transmission system for transmission of light components of a plurality of channels, the spectral sensitivity characteristics of the photodetectors are made different in bands in accordance with the light-emitting wavelength bands on the transmission side. Due to the advantages of the photodetectors, deterioration in transmission characteristics because of light of other channels or unnecessary light can be prevented, so that a plurality of channels can be well transmitted simultaneously.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a sectional view of a multilayer film on a light-receiving substrate in the first embodiment;

FIG. 5 is a chart showing X-ray diffraction patterns of multilayer filters fabricated at several substrate temperatures;

DETAILED DESCRIPTION OF THE PREFERRED EMBODIMENTS

Hereinbelow, photodetectors with a multilayer filter according to the present invention are described in detail with reference to the accompanying drawings.

(First Embodiment)

Figure 1:
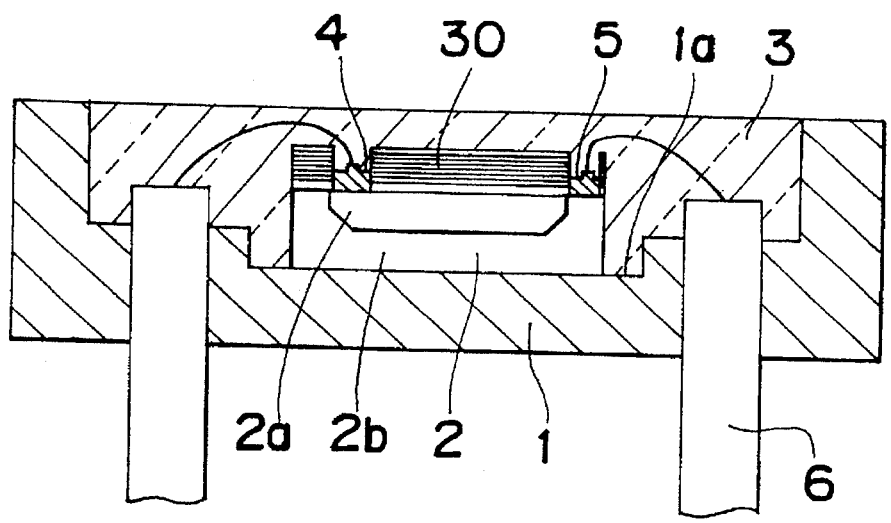
FIG. 1 is a sectional view of a photodetector with a multilayer filter according to a first embodiment of the present invention.
Figure 24:
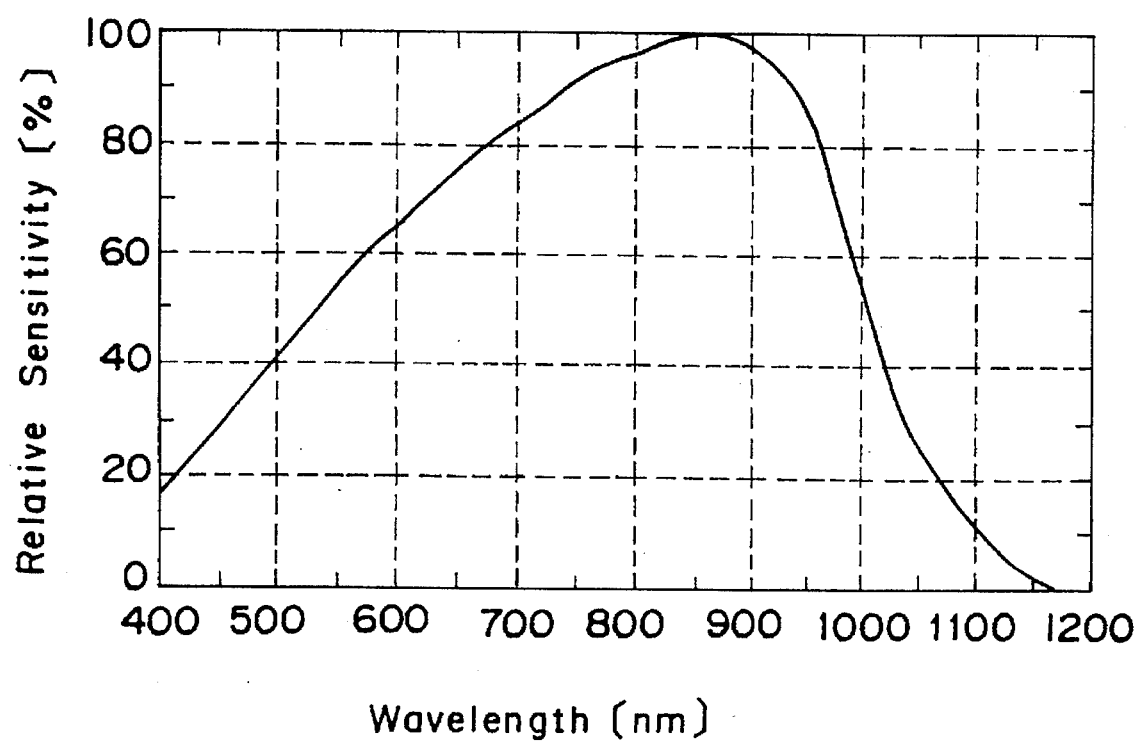
FIG. 24 is a graph showing an example of the spectral sensitivity characteristic of a Si photodiode.

FIG. 1 is a sectional view of the photodetector with a multilayer filter according to a first embodiment of the present invention. Referring to FIG. 1, a stem 1 made of ceramic or resin has a recessed portion 1a formed on its upper side. A light-receiving substrate 2 has an N-type layer 2b and a P-type layer 2a formed on the top surface side of N-type layer 2b as a light-receiving portion. The light-receiving substrate 2 is mounted on the bottom surface of the recessed portion 1a of the stem 1. A resin portion 3 is formed by pouring a transparent resin such as an epoxy resin into the recessed portion 1a of the stem 1 and then allowing it to be cured, so that the light-receiving substrate 2 is covered with the resin portion 3. An electrode pad 4 is formed on the P-type layer 2a of the light-receiving substrate 2. An electrode pad 5 is formed on the N-type layer 2b of the light-receiving substrate 2. Two metallic lead pins 6 are secured through the bottom of the recessed portion 1a of the stem 1. The metallic lead pins 6 are connected to the electrode pads 4, respectively, by wires of Au or the like. Also, an optical multilayer filter 30 is formed over regions other than regions of the electrode pads 4, 5 on the light-receiving substrate 2. In addition, the light-receiving substrate 2 is die-bonded to the stem 1 by using an adhesive of epoxy resins, phenol resins, or the like. The light-receiving substrate 2 constitutes a Si photodiode. A Si photodiode without a filter presents a better photo-detection sensitivity in an infrared region around a wavelength of 900 nm than in the visible region, as shown in FIG. 24.

Figure 2:
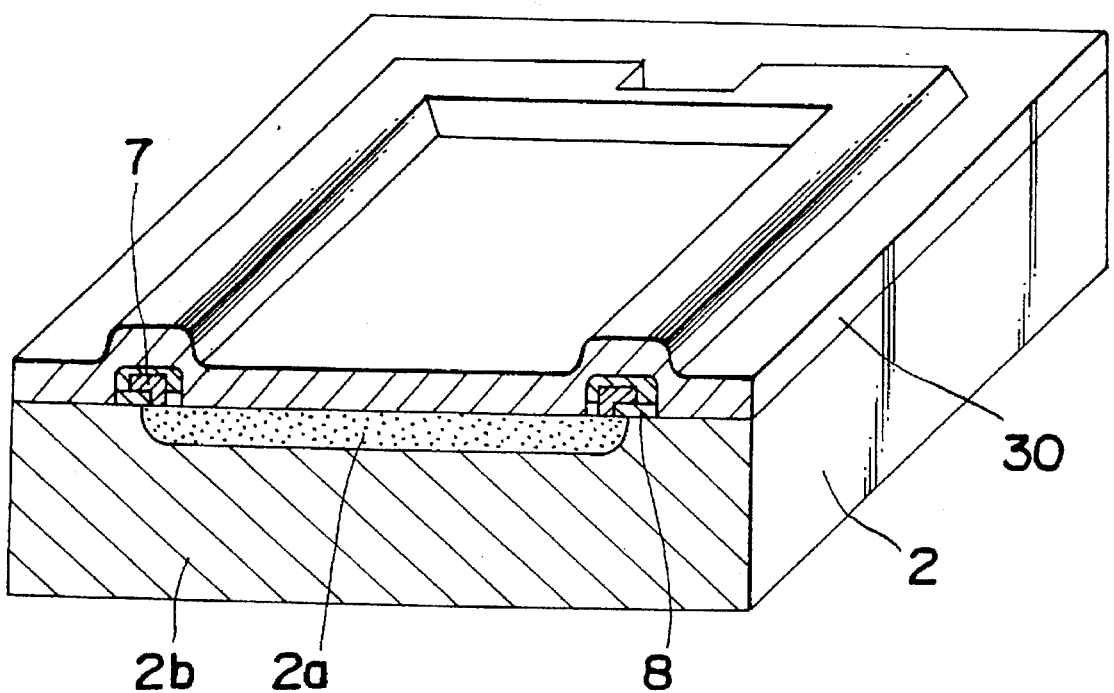
FIG. 2 is a perspective view of the light-receiving substrate in the first embodiment, part of the substrate being cut off.

FIG. 2 is a perspective view of the light-receiving substrate 2, part of which has been cut off vertically. Referring to FIG. 2, a guard ring electrode 7 is formed on the boundary between the P-type layer 2a and the N-type layer 2b of the light-receiving substrate 2. A protective film 8 made of $SiO_2$ or the like protects the PN junction surface between the P-type layer 2a and the N-type layer 2b as well as the guard ring electrode 7. The guard ring electrode 7 extends upward from around the P-type layer 2a and horizontally outward beyond the boundary between the P-type layer 2a and the N-type layer 2b, its end face being located above the N-type layer 2b. A portion of the optical multilayer filter 30 positioned above the guard ring electrode 7 is lifted.

FIG. 3 shows a sectional view of the optical multilayer filter 30. The optical multilayer filter 30 is formed by alternately laminating low refractive index films made of $SiO_2$ and high refractive index films made of $TiO_2$, so that the spectral sensitivity characteristic is close to the visual sensitivity. That is, optical film thicknesses of the films constituting the optical multilayer filter 30 form three arithmetic series 31, 32, and 33 in this order, where the common difference of the arithmetic series 31, 32, and 33 is changed in three steps. In addition, every adjacent two of the arithmetic series 31, 32, 33 share one film that serves as both the first term of one series and the last term of the other series.

The optical film thicknesses in an actual case are described below. Referring to FIG. 3, the optical multilayer film 30 serving as an optical filter comprises thirty laminated layers of low refractive index films A, high refractive index films B, and a matching film C. In the figure, numbers of 1st to 30th layers and their optical film thicknesses are added on the right side of each layer, while reference characters A, B, and C indicating the low refractive index film, the high refractive index film, and the matching film, respectively, are added on the left side. The reference optical wavelength is assumed to be 820 nm (hereinafter, represented by $\lambda$).

The matching film C of the 1st layer has an optical film thickness of $0.7\lambda/4$, serving as an antireflection film for the light-receiving substrate and the other films containing no matching film. The optical film thickness of the 2nd layer is $0.82\lambda/8$.

As for the 3rd to 11th layers, their optical film thicknesses form an arithmetic series 31 the common difference of which is $0.03\lambda/4$. More specifically, the optical film thickness of the 3rd layer is $0.82\lambda/4$, that of the 4th layer is $0.85\lambda/4$, that of the 5th layer is $0.88\lambda/4$, and the optical film thicknesses of the 6th to 11th layers increase by steps of $0.03\lambda/4$, the optical film thickness of the 11th layer being $1.06\lambda/4$. It is noted that the 11th layer serves as both the last term of the arithmetic series 31 and the first term of the next arithmetic series 32.

Also, in the 11th to 27th layers, their optical film thicknesses form the arithmetic series 32 the common difference of which is $0.018\lambda/4$. That is, the optical film thickness of the 12th layer is $1.078\lambda/4$, that of the 13th layer is $1.096\lambda/4$, and the optical film thicknesses of the 14th to 27th layers increase by steps of $0.018\lambda/4$, the optical film thickness of the 27th layer being $1.348\lambda/4$. The 27th layer serves as both the last term of the arithmetic series 32 and the first term of the next arithmetic series 33.

The 27th to 29th layers have an equal optical film thickness of $1.348\lambda/4$ and can be regarded as an arithmetic series 33 having a common difference of 0. The optical film thickness of the 30th layer is $1.348\lambda/8$.

As described above, the 3rd to 29th layers are arranged into the arithmetic series 31, 32, 33 that differ from one another in common difference. In addition, the matching film C for matching of refractive index between the light-receiving substrate 2 and the optical multilayer film 30 is usually a mono-layer film of $ZrO_2$, $Si_3N_4$, or the like, but in some cases composed of 2 or more layers. In the case of FIG. 3, the matching film C is made of $SiO_2$ and therefore integrated with the low refractive index film made of $SiO_2$ of the 2nd layer. Also, depending on the refractive index of the resin portion 3 that is not shown in FIG. 3, there may arise a need of adding to the uppermost layer a matching film of a low refractive index for matching between the optical multilayer filter 30 and the transparent resin of the resin portion 3.

Next described is the method of fabricating the above photodetector with the multilayer filter.

(1) Process of removing a $SiO_2$ layer

Figure 4A:
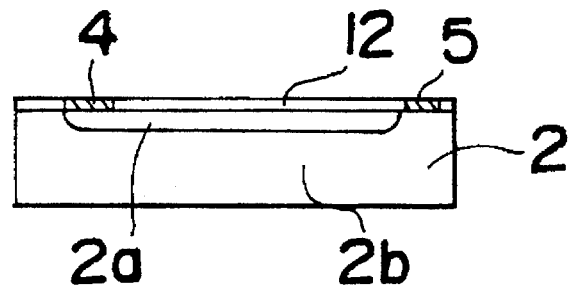
FIGS. 4A, 4B, 4C, 4D and 4E illustrate steps of a process of fabricating the photodetector with the multilayer filter of the first embodiment.

FIG. 4A illustrates a state before a $SiO_2$ layer 12 on the light-receiving substrate 2 is removed. The light-receiving substrate 2, before the multilayer film is formed, has the $SiO_2$ layer 12 provided thereon to serve as a masking layer or a passivation layer during a process of diffusion of impurities. Forming the multilayer film directly on this $SiO_2$ layer 12 would result in an undesirable spectral sensitivity characteristic due to effects of interference between the $SiO_2$ layer 12 and the multilayer film. It is noted that a plurality of the light-receiving substrates 2 are formed on a wafer, and those light-receiving substrates on the same wafer are subjected to the following process together until they are divided in a later-described mounting process.

Figure 4B:
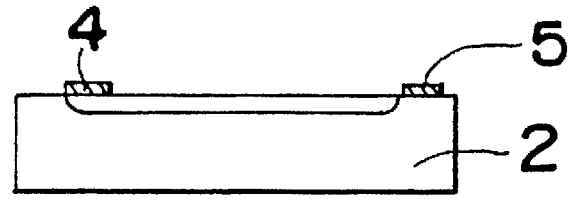

First, for example, a negative type resist, such as OMR-83 made by Tokyo Oka K.K. or the like, is applied onto the light-receiving substrate 2. Then, after prebaking of the light-receiving substrate 2, the applied resist is subjected to exposure and development to be patterned. The resulting resist pattern covers the electrode pads 4, 5 and others, but is open in portions corresponding the $SiO_2$ layer to be removed. After this, the resist pattern is cured by postbaking, and thereafter, as shown in FIG. 4B, the $SiO_2$ layer 12 is removed in a solution of buffered hydrofluoric acid or the like by etching. Then, the resist is removed with a resist-stripping solution.

(2) Process of fabricating a multilayer film

Figure 4C:
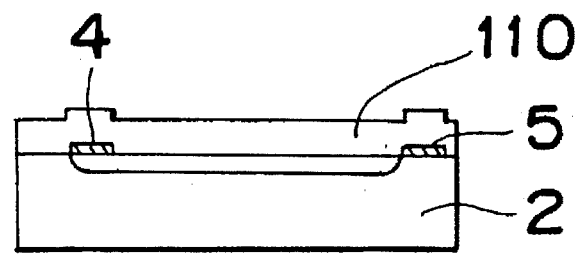

Next, as shown in FIG. 4C, with the temperature of the light-receiving substrate 2 in the range of 150° C. to 250° C., low refractive index films made of $SiO_2$ and high refractive index films made of $TiO_2$ are alternately laminated on the light-receiving substrate 2 by using an electron-beam evaporator so that an optical multilayer film 110 is formed.

The temperature condition of the light-receiving substrate 2 during fabrication of the optical multilayer film 110 is very important because it has a close relation to etching conditions for the optical multilayer film 110 in later processes. In other words, in the electron-beam evaporation, the multilayer film is suppressed from being crystallized by controlling the temperature of the light-receiving substrate 2, so that the etching is facilitated.

FIG. 5 shows X-ray diffraction patterns, which are the results of crystal structure analysis, by using X-rays, of the multilayer film composed of alternate $TiO_2$ and $SiO_2$ layers formed by electron-beam deposition on the light-receiving substrate 2 at the substrate temperatures 180° C., 240° C., and 260° C., respectively. In the optical multilayer film fabricated at the temperature of the light-receiving substrate 2 of 260° C., there appeared peaks showing an anatase type crystal structure in the high refractive index layers made of $TiO_2$, which indicates that the multilayer film has been partially micro-crystallized. Also, in the optical multilayer film fabricated at the temperature of the light-receiving substrate 2 of 240° C., slight peaks can be seen which show an anatase type crystal structure of $TiO_2$. Meanwhile, in the optical multilayer film fabricated at the temperature of the light-receiving substrate 2 of 180° C., no peaks are seen, which indicates that the multilayer film has not been crystallized. From these results, it can be understood that the high refractive index films made of $TiO_2$ progress in crystallization at the temperatures of the light-receiving substrate 2 above 240° C. In addition, none of the X-ray diffraction patterns for the different substrate temperatures indicate crystallization of the low refractive index films made of $SiO_2$. When the resultant multilayer films were etched with a mixed solution of hydrofluoric acid and sulfuric acid, the optical multilayer film fabricated at the temperature of the light-receiving substrate 2 of 180° C. could be etched while the optical multilayer film fabricated at the temperature of the light-receiving substrate 2 of 260° C. did not dissolve. The optical multilayer film fabricated at the temperature of the light-receiving substrate 2 of 240° C. dissolved with slight difficulty, showing that this temperature is the critical temperature for etching.

Figure 6:
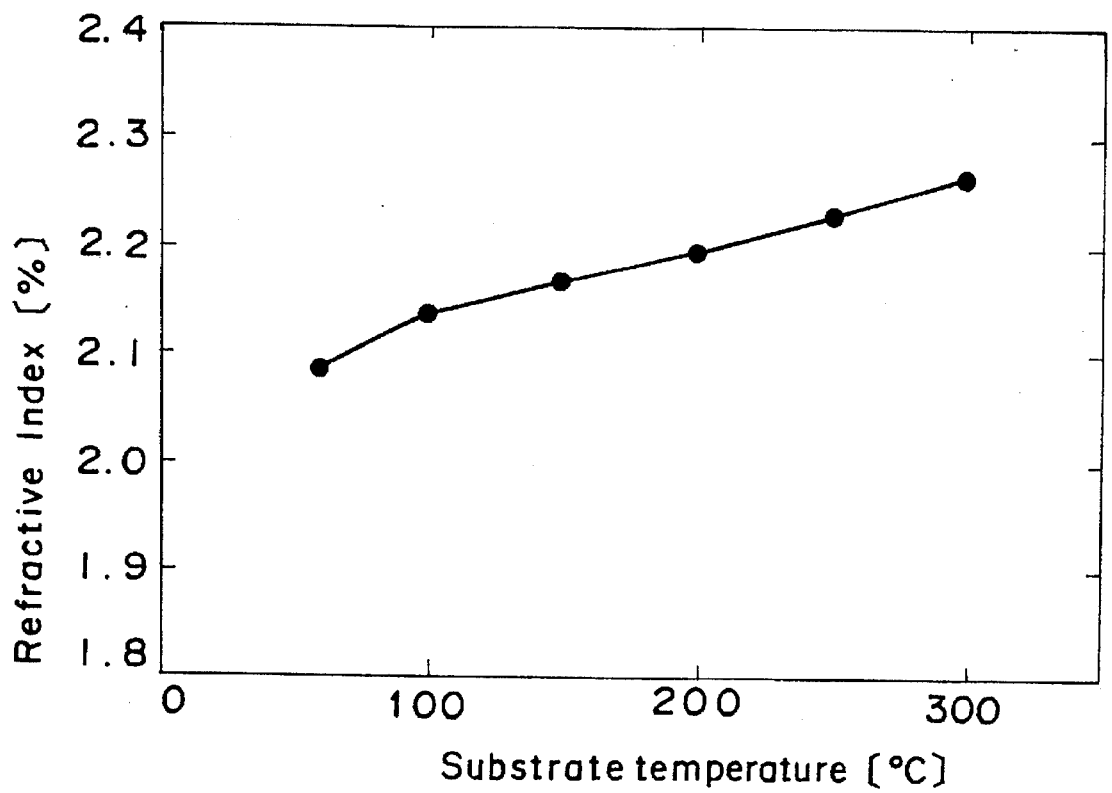
FIG. 6 is a graph showing the dependency of the refractive index of the high refractive index film made of $TiO_2$ upon the substrate temperature.

As shown above, from the relationship between the results of the above crystal structure analysis and the possibility of etching, it can be said that an amorphous state of the high refractive index film made of $TiO_2$ allows wet etching to be carried out. Therefore, the optical multilayer film should be fabricated at temperatures lower than that at which the high refractive index film is crystallized, in order to facilitate the wet etching. However, the refractive index of the high refractive index film made of $TiO_2$ becomes greater as the temperature of the light-receiving substrate 2 rises, as shown in FIG. 6. Thus, from the viewpoint of filter characteristics of the multilayer film, the substrate temperature should be high. From this point of view, in the present embodiment, the optical multilayer film is formed while the light-receiving substrate 2 is heated at a temperature in the range of 150° C. to 250° C.

(3) Process of etching of the multilayer film

Figure 4D:
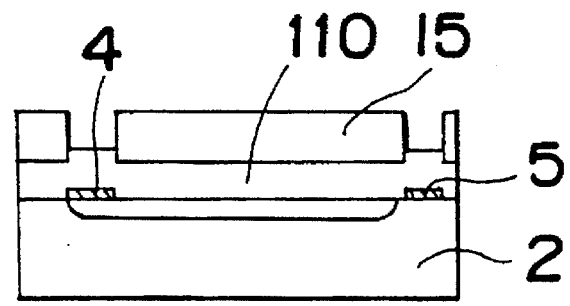

Next, after drying the light-receiving substrate 2, on which the optical multilayer film 110 has been formed, an adhesion accelerator is applied onto the light-receiving substrate 2 for enhancement in adhesion between the wafer and resist. Thereafter, the light-receiving substrate 2 is heated in an oven, so that a solvent in the adhesion accelerator is removed sufficiently. Then, as shown in FIG. 4D, a negative type resist, such as OMR-83 made by Tokyo Oka K.K., for example, is applied to a thickness of at least 6 to 10 μm. This resist is prebaked at a given temperature and thereafter subjected to exposure and development. Part of the resist is removed so that the optical multilayer film 110 is exposed at their portions corresponding to the electrode pads 4, 5, whereby a resist pattern 15 is formed. After this, the resist pattern 15 is cured by postbaking. In addition, in the case where the light-receiving substrate has an arrangement that the light-receiving portion is divided into a plurality of portions, the resist is also removed at its portions corresponding to the divisional lines that divide the light-receiving portion.

Then, with the mixed solution of hydrofluoric acid and sulfuric acid controlled to a specified temperature, the light-receiving substrate 2 of FIG. 4D on which the resist has been patterned, i.e. a wafer with the optical multilayer film is thrown into the solution. The solution is kept being stirred until the etching of the exposed optical multilayer film 110 is completed. For this process, etching conditions for the non-crystallized optical multilayer film 110 are, for example, a mixing ratio of hydrofluoric acid:sulfuric acid:water=1:4:1 to 1:6:1 for an etching solution, a temperature of the etching solution of 20°±5° C., and an etching rate of 0.08 to 0.15 μm/sec. It is to be noted that the higher the temperature of the etching solution, the faster the etching rate (e.g., the etching rate is approximately 0.2 μm/sec for a solution temperature of 30° C). On the other hand, the rise of the temperature of the etching solution increases the evaporation loss of hydrofluoric acid. Therefore, it becomes more difficult to control the concentration of the etching solution as the solution temperature increases. Further, if the etching is carried out at 50° C. or higher, the resist will be stripped in a short time, making it impossible to form a resist pattern.

Figure 4E:
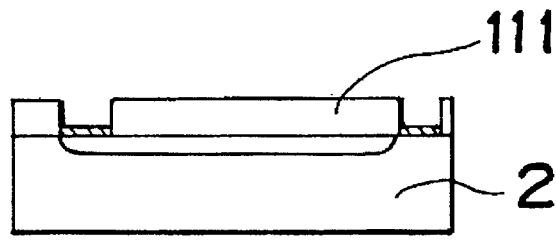

Then, an optical multilayer filter 111 is formed in which portions corresponding to the electrode pads 4, 5 have been removed as a result of completion of the etching, as shown in FIG. 4E. Thereafter, the wafer is taken out of the mixed solution at once, and washed with pure water promptly. Then, after the wafer is washed with water and dried appropriately, the resist pattern 15 is removed by using the resist-stripping solution.

(4) Mounting process

Next, the wafer that has undergone the etching process of the optical multilayer film is divided into individual chips by the scribing method or dicing or the like. Further, as shown in FIG. 1, the individual chips, i.e. the light-receiving substrates 2, are die-bonded to the bottom of the recessed portion 1a of the ceramic stem 1 with an adhesive of epoxy resins or phenol resins or the like. Thereafter, the electrode pads 4, 5 on the light-receiving substrate 2 and the lead pins 6 are wire-bonded to each other with wires of Au or the like. Finally, an epoxy resin or a silicon resin is filled to form the resin portion 3. Coating the light-receiving substrate 2 with the resin portion 3 prevents any deterioration in characteristics due to humidity, whereby the environmental resistance is enhanced.

Figure 7:
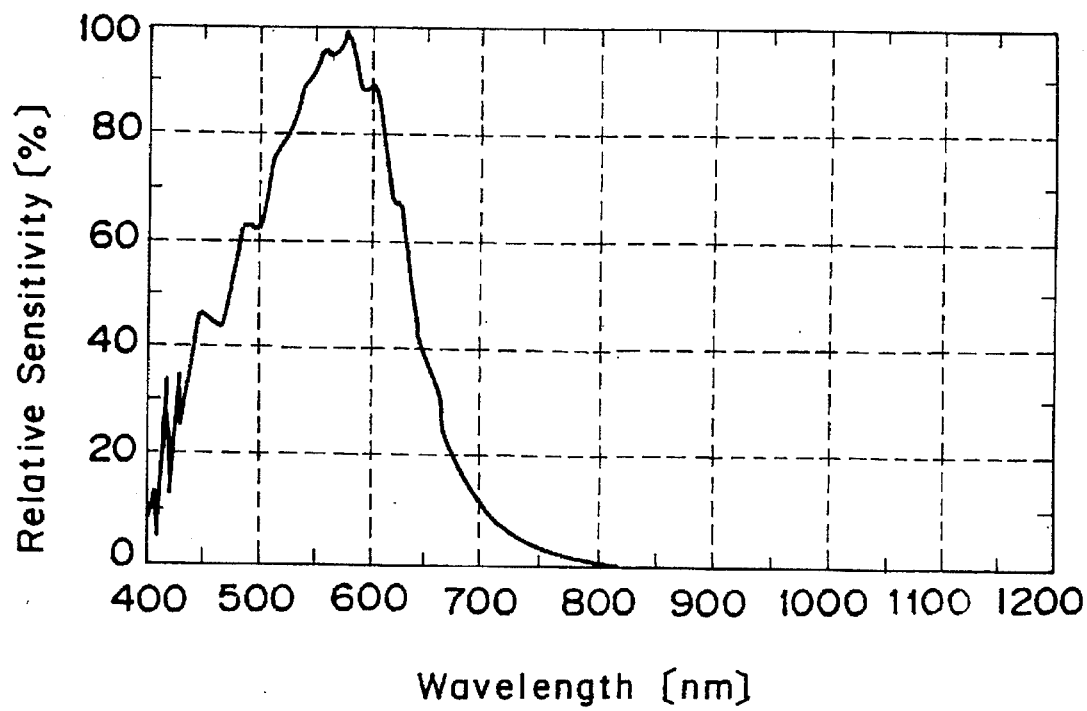
FIG. 7 is a graph showing the spectral sensitivity characteristic of the photodetector of the first embodiment.

In this way, the photodetector with the multilayer filter fabricated through the processes of FIG. 4A to 4E and the mounting process can obtain a spectral sensitivity characteristic corrected for visual sensitivity, as shown in FIG. 7. Also, the optical multilayer filter 111 is prevented from being misted by moisture in the air or the like and therefore prevented from deterioration in characteristics. Further, since the optical multilayer filter 111 serves as a protective film for the light-receiving substrate 2, the photodetector with the multilayer filter is improved in reliability. In addition, the optical multilayer film 110 for a plurality of light-receiving substrates in the same wafer can be formed at the same time, and the work of mounting the conventional glass absorption filter to each photodetector is eliminated. Furthermore, since wet etching can be employed to pattern the optical multilayer filter instead of dry etching such as the ion-beam etching and the plasma etching, a more successful mass productivity of the photodetector with a multilayer filter can be offered than when dry etching is employed and moreover, damage of semiconductor crystals of the light-receiving substrate 2 caused by ion beams is avoided. Accordingly, a photodetector with a multilayer filter can be provided which is low in cost and improved in reliability.

(Second Embodiment)

Figure 8:
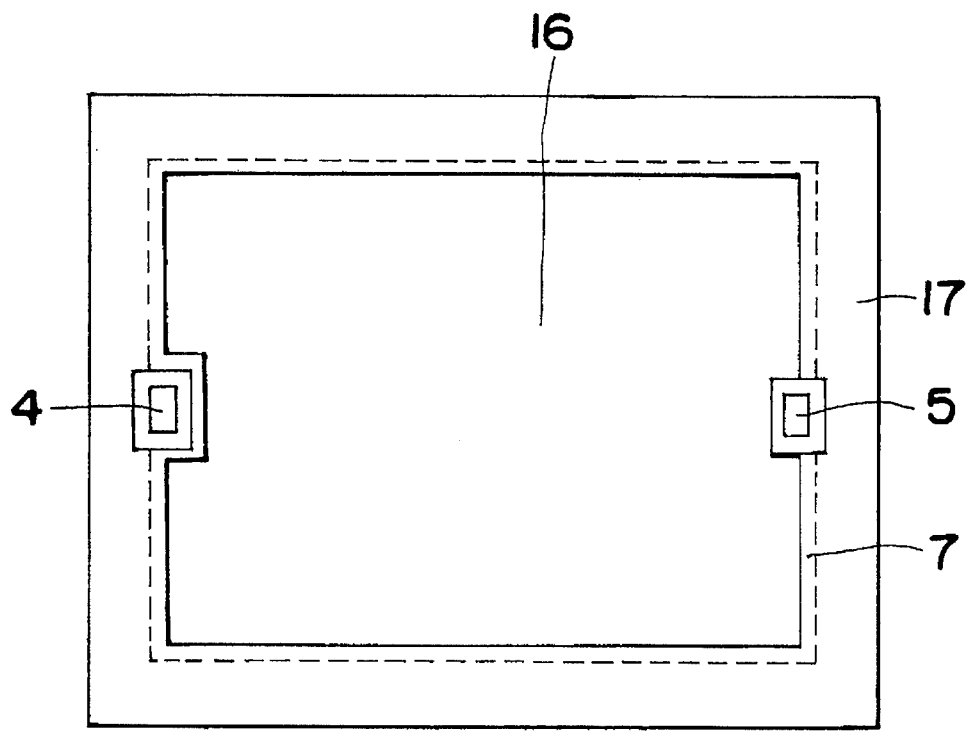
FIG. 8 is a top view of a photodetector with a multilayer filter according to a second embodiment of the present invention.
Figure 9:
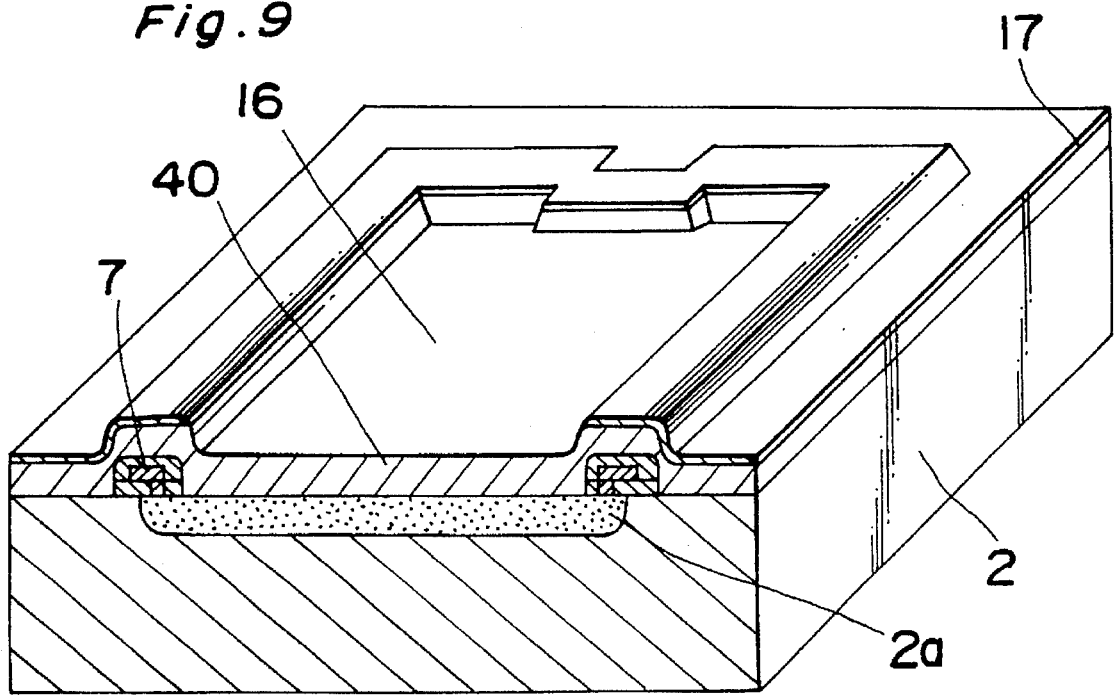
FIG. 9 is a perspective view of a light-receiving substrate with a multilayer filter for the photodetector of the second embodiment, part of the light-receiving substrate being cut off.

FIG. 8 shows a top view of a photodetector with a multilayer filter according to a second embodiment of the present invention. FIG. 9 shows a perspective view of the light-receiving substrate 2 of the photodetector with a multilayer filter 40 according to the second embodiment, where part of the light-receiving substrate is cut off vertically. Portions of the multilayer filter 40 other than a portion 16 corresponding to the P-type layer 2a serving as the light-receiving portion of the light-receiving substrate 2 is coated with a metal film or the like which serves as a light-shielding film 17. The light-shielding film 17 reflects light directed to the guard ring electrode 7. Accordingly, light is prevented from being scattered by the guard ring electrode 7 due to its rough surface, then propagating through the optical multilayer film 40, and finally being received by the end face of the light-receiving substrate 2.

Now the method of fabricating the photodetector with a multilayer filter having the light-shielding film is described below.

Steps shown in FIGS. 10A to 10E are the same as the steps of FIG. 4A to 4E of the first embodiment, so that in the figures the same components are designated by the same reference numerals and a detailed description is omitted.

Figure 10A:
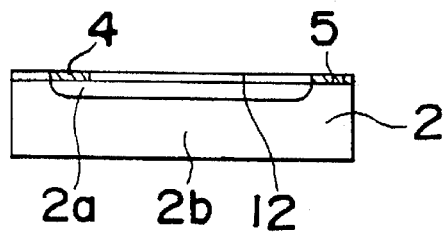
FIGS. 10A, 10B, 10C, 10D, 10E, 10F and 10G illustrates steps of a process of fabricating the photodetector of the second embodiment.
Figure 10B:
Figure 10C:
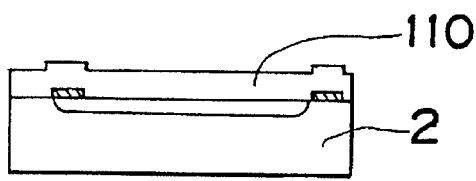
Figure 10D:
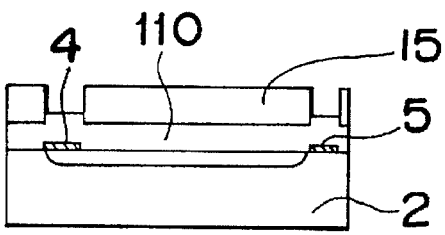
Figure 10E:
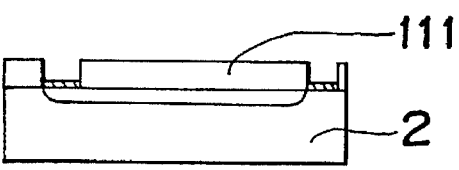
Figure 10F:
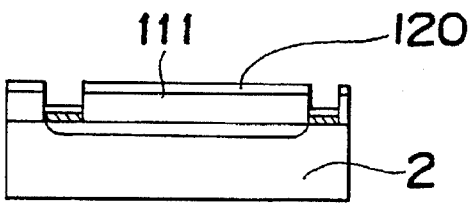
Figure 10G:
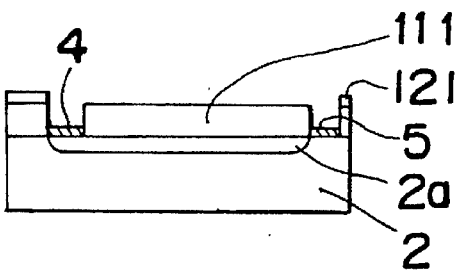

After the wafer provided with a plurality of photodetectors with multilayer filter is fabricated through the steps of FIG. 10A to 10E, a metal such as Al, Ni, Cu, or the like is deposited on the optical multilayer film 111, so that a metal film 120 is formed, as shown in FIG. 10F. Subsequently, as shown in FIG. 10G, a resist pattern covering regions of the metal film 120 other than both the region corresponding to the P-type layer 2a and the regions corresponding to the electrode pads 4, 5 is formed, and thereafter an unnecessary metal film 120 portion positioned at the region corresponding to the light-receiving portion is removed by etching, whereby a light-shielding film 121 is formed. Then the resist is stripped off after etching. It is noted that as the etching solution for this process, phosphoric acid or a mixed solution of phosphoric acid and nitric acid is typically used when the metal film 120 is made of Al, and nitric acid is typically used when the metal film 120 is made of Ni. Also, when the metal film 120 is made of Cu, ammonium persulfate is typically used as the etching solution.

Now another process for fabricating the photodetector with multilayer filter of the second embodiment is described below.

Steps shown in FIGS. 10A to 10C are the same as the steps of FIG. 4A to 4C of the first embodiment, so that in the figures the same components are designated by the same reference numerals and a detailed description is omitted.

Figure 11A:
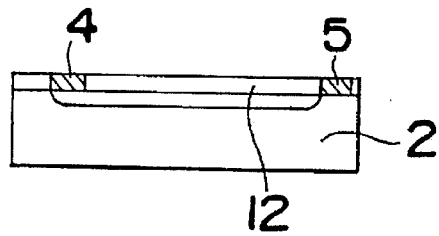
FIGS. 11A, 11B, 11C, 11D, 11E, 11F and 11G illustrates steps of another process of fabricating the photodetector of the second embodiment.
Figure 11B:
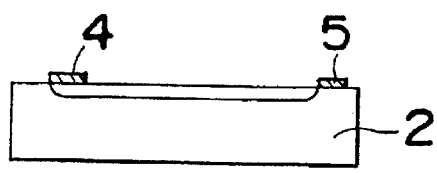
Figure 11C:
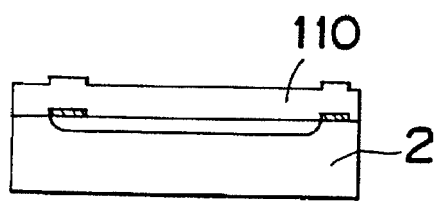
Figure 11D:
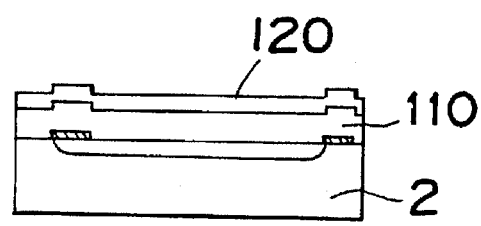
Figure 11E:
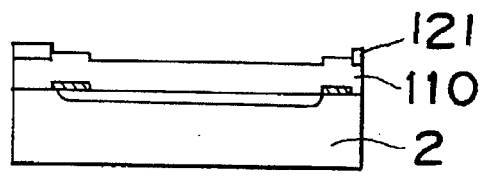
Figure 11F:
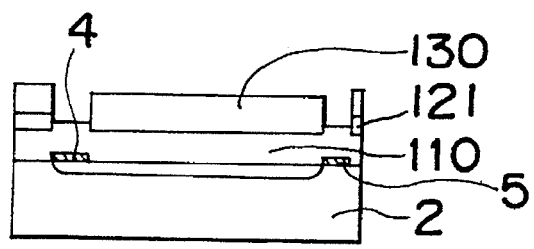
Figure 11G:
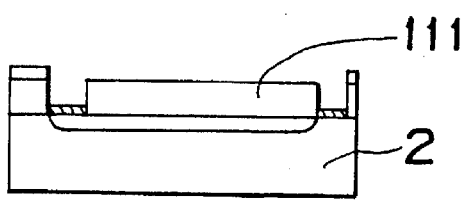

After the optical multilayer film 110 is formed on the wafer at the step shown in FIG. 11C, a metal film 120 of Al, Ni, Cu, or the like is formed on the optical multilayer film 110 by vapor deposition or other methods as shown in FIG. 11D. Subsequently, as shown in FIG. 11E, the metal film 120 is patterned, whereby a light-shielding film 121 is formed. Thereafter, as shown in FIG. 11F, a resist pattern 130 is formed. The resist pattern 130 covers both the light-shielding film 121 and the exposed optical multilayer film 110 except for its portions corresponding to the electrode pads 4, 5. Then, as shown in FIG. 11G, the optical multilayer film 110 are patterned by etching in accordance with the resist pattern, so that the optical multilayer filter 111 is formed.

In this way, light coming toward the guard ring electrode 7 is reflected by the light-shielding films 17, 121, whereby any deterioration in spectral sensitivity characteristic can be prevented. Thus, good characteristics can be obtained.

(Third Embodiment)

When light enters only on the surface side of the photodetector, the light-shielding film of the second embodiment suffices. However, when light is incident on side faces of the light receiving substrate, there is possibility that the spectral sensitivity characteristic may deteriorate.

Figure 12:
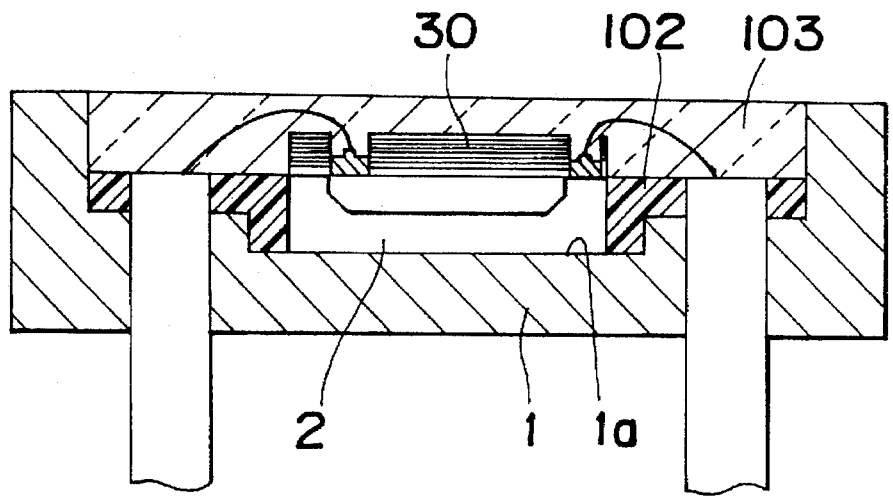
FIG. 12 is a sectional view of a photodetector with a multilayer filter according to a third embodiment of the present invention.

FIG. 12 shows a photodetector according to the third embodiment which is of the same arrangement as the photodetector shown in FIG. 1, except for the resin portion. In FIG. 12 and FIG. 1, same components are designated by the same reference numerals.

In this embodiment, after the light-receiving substrate 2 is die-bonded to the bottom of the recessed portion 1a of the stem 1, an opaque resin is poured into the recessed portion 1a of the stem 1 and then cured, so that an opaque resin portion 102 is formed. The surface plane of the opaque resin 102 is flush with the surface of the light-receiving substrate 2. Further, a transparent resin such as an epoxy resin is poured onto the light-receiving substrate 2 and the opaque resin portion 102 and then cured, so that a transparent resin portion 103 is formed. By this arrangement, visible rays of light and infrared rays of light incident on the side face of the light-receiving substrate 2 are absorbed by the opaque resin 102, so that unnecessary light can be prevented from entering inside through the side face of the light-receiving substrate 2. As a result, light reception at the side face of the light-receiving substrate 2 can be eliminated. Thus, a photodetector with a multilayer filter having a good spectral sensitivity characteristic can be realized.

(Fourth Embodiment)

Figure 13A:
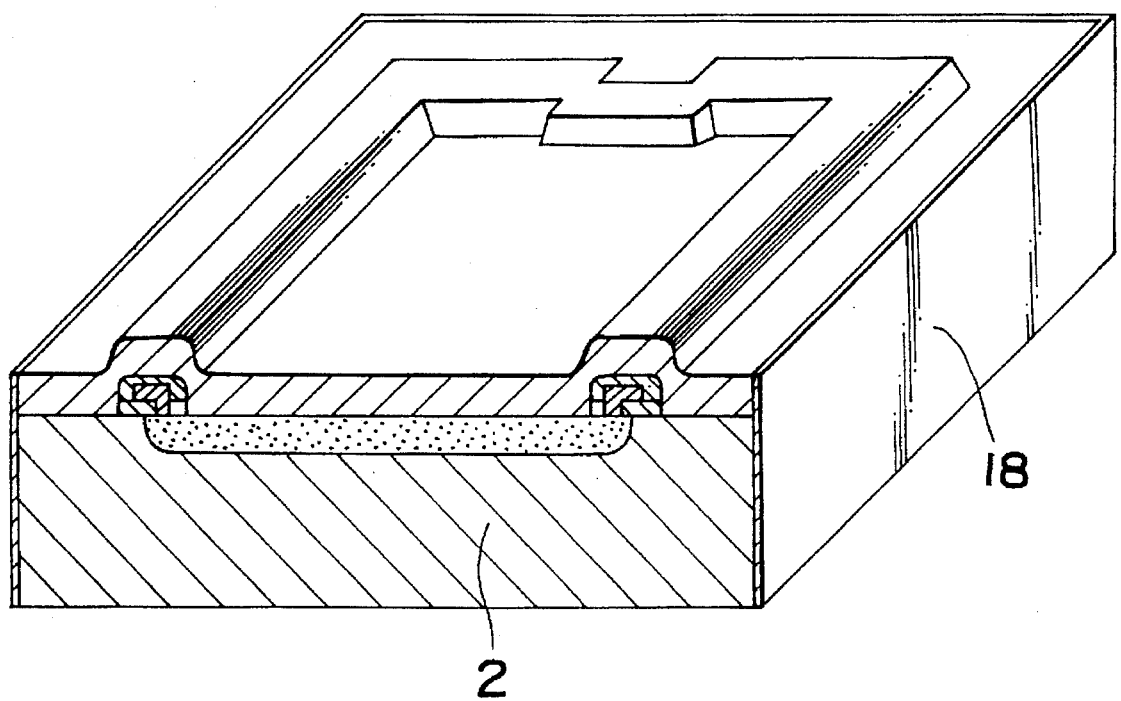
FIG. 13A is a perspective view of a light-receiving substrate for a photodetector according to a fourth embodiment of the present invention, part of the light receiving substrate being cut off.
Figure 13B:
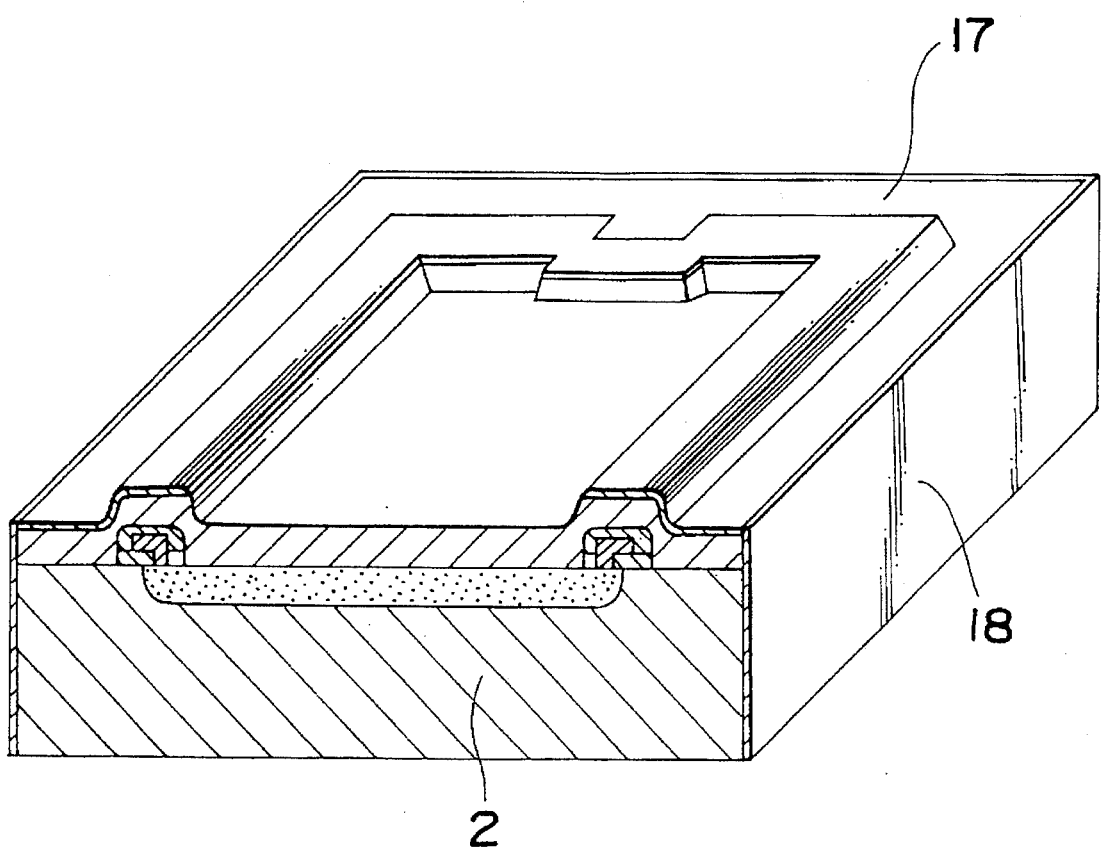
FIG. 13B is a perspective view of a variant of the light receiving substrate of FIG. 13A, part of the light receiving substrate being cut off.

FIG. 13A shows a perspective view of a light-receiving substrate 2 of a photodetector with a multilayer filter according to a fourth embodiment of the present invention, where part of the light receiving substrate has been cut off vertically. In the figure, used as the light-receiving substrate 2 is a light-receiving substrate fabricated according to the first embodiment. The light-receiving substrate 2 may be provided with the light-shielding film 17 as in the second embodiment, as shown in FIG. 13B. On the overall side surface of the light-receiving substrate 2, a light-shielding substrate 18 is formed as a metal reflective film made of Al, for example. The light-shielding substrate 18 reflects light incident on the side surface of the light-receiving substrate 2, thus preventing light from entering the light-receiving substrate 2.

Figure 14A:
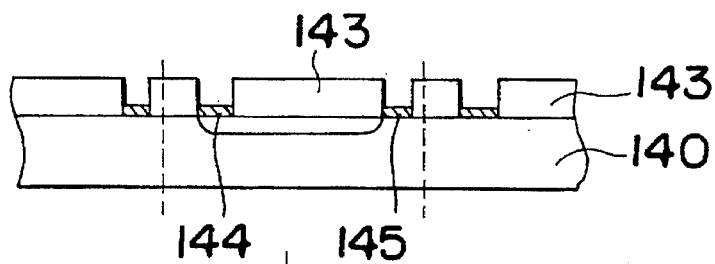
FIGS. 14A, 14B and 14C illustrate steps of a process of fabricating a photodetector with a multilayer filter for the photodetector of the fourth embodiment.
Figure 14B:
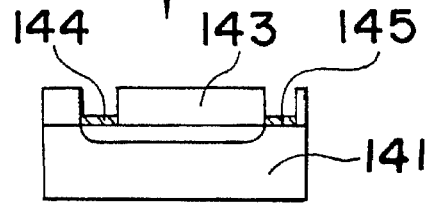
Figure 14C:
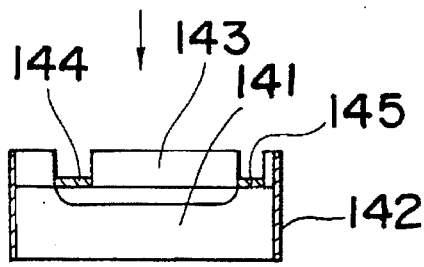

FIGS. 14A to 14C show the process of fabricating the photodetector with a multilayer filter according to the fourth embodiment. First, as shown in FIG. 14A, a plurality of photodetectors with a multilayer filter are fabricated in a wafer 140 in accordance with the process in the first or second embodiment. In FIG. 14A, a reference numeral 143 designates a multilayer filter, and reference numerals 144 and 145 designate electrode pads. Subsequently, as shown in FIG. 14B, the wafer 140 is divided by dicing or other appropriate methods whereby a light-receiving substrate 141 is obtained. Next, as shown in FIG. 14C, a light-shielding film 142 of a metal such as Al is formed on the side surface of the light-receiving substrate 141 by a sputtering method or other appropriate methods. Since the light-shielding film 142 needs to be formed on the overall side surface of the light-receiving substrate 141, the sputtering, which offers good step coverage, is suited for film formation on the side surface. In a fabrication step shown in FIG. 14A, resist may be applied onto the multilayer film 143 and electrode pads 144, 145 on the light-receiving substrate 2 prior to the division of the wafer 140, and the resist may be removed after the light-shielding film 142 is formed on the side surface of the light-receiving substrate 2. If these steps are taken, the metal reflective film can be prevented from being formed even on the multilayer filter 143 on the light-receiving substrate 2.

Light incident on the side surface of the light-receiving substrate 141 is reflected by the light-shielding film 142 on the side surface, thus being prevented from entering inside through the side surface of the light-receiving substrate 141. Thus, light reception at the side surface of the light-receiving substrate 141 can be eliminated, so that a photodetector with a multilayer filter having a good spectral sensitivity characteristic can be realized.

(Fifth Embodiment)

Figure 15:
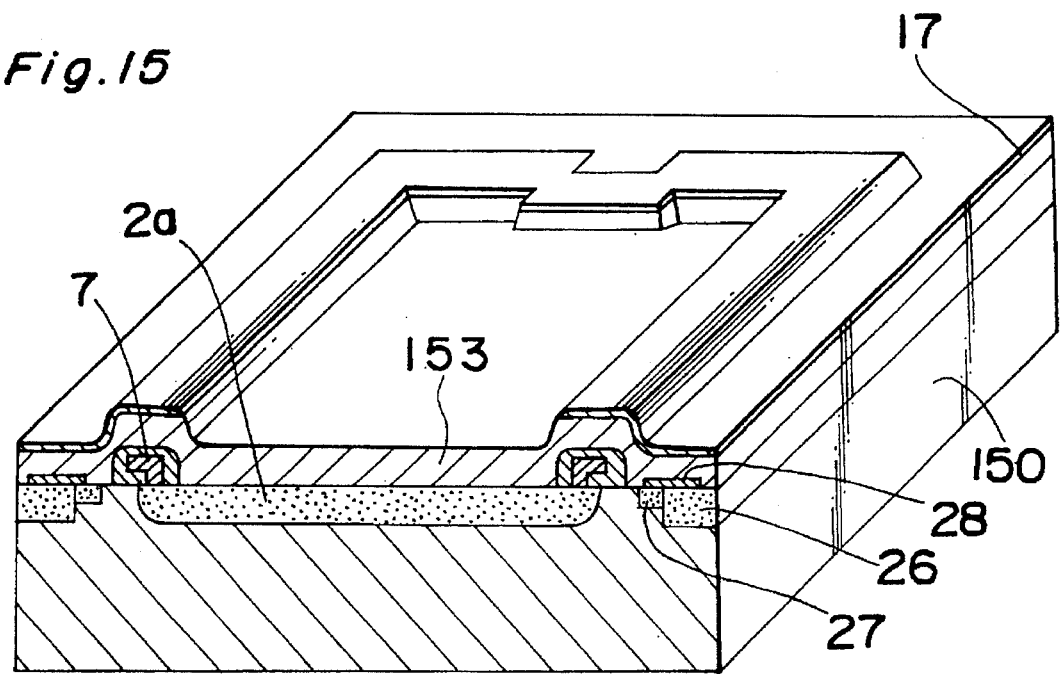
FIG. 15 is a perspective view of a light-receiving substrate for a photodetector in a fifth embodiment of the present invention, part of the substrate being cut off.

FIG. 15 shows a perspective view of a light-receiving substrate 2 of a photodetector with a multilayer filter according to a fifth embodiment of the present invention, where part of the light receiving substrate has been cut off vertically. A P-type impurity such as boron (B) is diffused in the periphery of the upper surface of a light-receiving substrate 150, whereby a $P^+$ layer 26 having a high impurity concentration is formed. Further, an type impurity such as phosphorus (P) is diffused inside the $P^+$ layer 26, whereby an $N^+$ layer 27 having a high impurity concentration is formed. On the $P^+$ layer 26 and the $N^+$ layer 27, a metal layer 28 for short-circuiting between the $P^+$ layer 26 and the $N^+$ layer 27 is formed. Furthermore, as in the second embodiment shown in FIGS. 8 and 9, a light-shielding film 17 is formed on the multilayer filter on the light receiving substrate other than the region corresponding to the P-type layer 2a serving as the light-receiving portion.

In the photodetector with a multilayer filter with the above arrangement, when light enters the side face of the light-receiving substrate 150, carriers generated by the incident light are absorbed by the $P^+$ layer 26 and the $N^+$ layer 27 joined together by PN junction. Further, since the $P^+$ layer 26 and the $N^+$ layer 27 are short-circuited by the metal layer 28, photocurrents can be prevented from being generated due to the incident light. By eliminating light reception at the side surface of the light-receiving substrate 150, which surface has neither a multilayer film nor a light-shielding film, as described above, the photodetector of this embodiment has a good spectral sensitivity characteristic. Furthermore, employment of the light-shielding film 17 prevents any deterioration in spectral sensitivity characteristic due to scattering of light at the guard ring electrode 7. However, even in the photodetector with a multilayer filter of the fifth embodiment without the light-shielding film 17, if light scattered by the guard ring electrode 7 is received in a region of the surface-side periphery of the light-receiving substrate 150, deterioration in the spectral sensitivity characteristic can be prevented to some extent.

In the fifth embodiment, the $P^+$ layer 26 and the $N^+$ layer 27 having high impurity concentrations are designed to be short-circuited by the metal layer 28. However, the metal layer 28 is not essential because the $P^+$ layer and the $N^+$ layer joined together only by PN junction can have an effect.

Materials of the photodetectors of the above embodiments should not be limited to those specified in the above. Also, the structure of the multilayer film serving as a multilayer filter is not limited to that shown in FIG. 3, but should be appropriately changed according to the purpose for which the photodetector is used.

The photodetector of the invention constructed as described above can be used in various applications, as described below.

Figure 16:
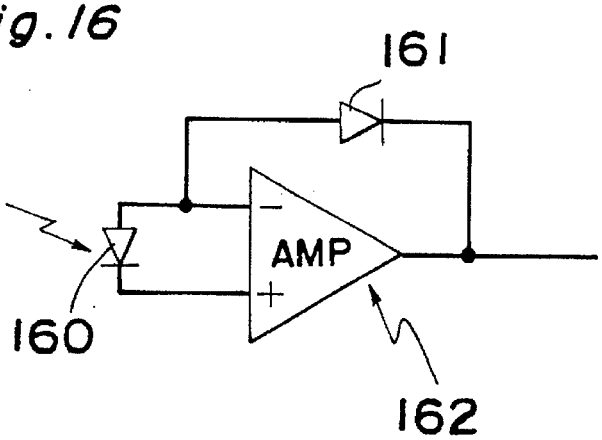
FIG. 16 is a light measuring circuit employing the present invention for use in an automatic exposure system of a camera.

FIG. 16 shows a light measuring circuit of an automatic exposure system of a camera using a photodetector 160 of the present invention. In the figure, the anode of the photodetector 160 whose spectral sensitivity characteristic is adjusted to visual sensitivity is connected to an input terminal (−) of an amplifier AMP, while the cathode of the photodetector 160 is connected to another input terminal (+) of the amplifier AMP. Also, the anode of a log diode 161 is connected to the input terminal (−) of the amplifier AMP, while the cathode of the log diode 161 is connected to the output terminal of the amplifier AMP. The amplifier AMP and the log diode 161 make up a logarithmic amplifier circuit 162.

With the above arrangement, incident light is converted into a current by the photodetector 160, and then logarithmically transformed by the logarithmic amplifier circuit 162, thus outputted as a voltage signal. The voltage signal is processed by using an unshown processor such as a microcomputer. Then the diaphragm of the camera and its exposure time are controlled according to the quantity of the incident light. Accordingly, by adjusting the spectral sensitivity characteristic of the photodetector 160 to the visual sensitivity, there can be provided an automatic exposure system capable of accurate measurement of quantity of light.

Figure 17:
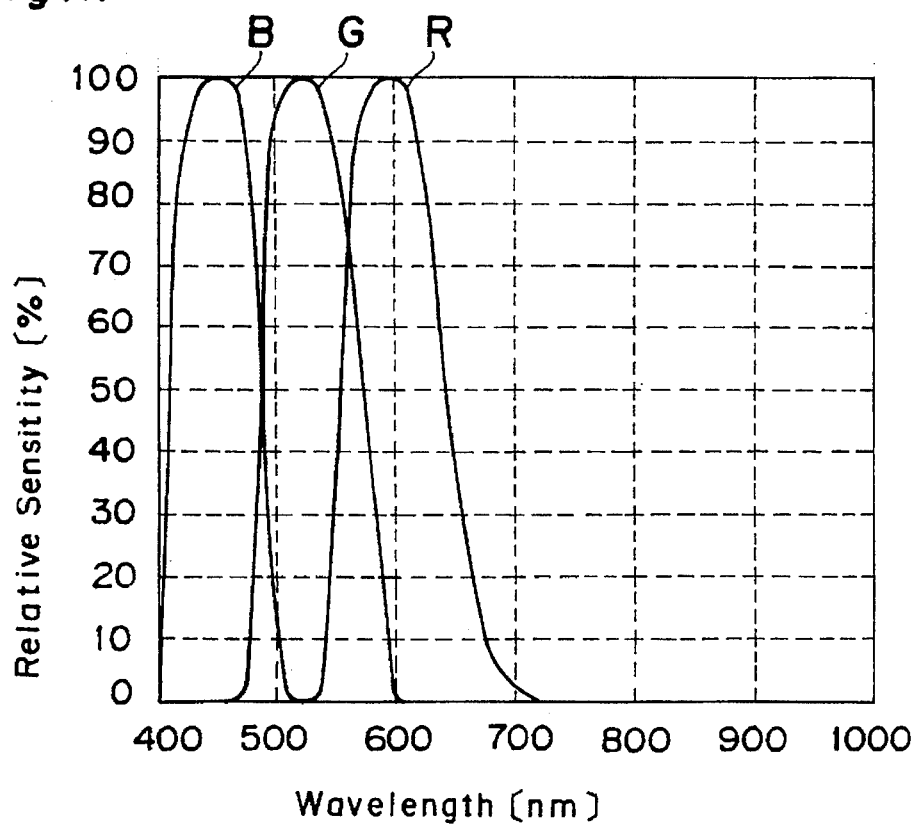
FIG. 17 is a graph showing photo-detection sensitivity characteristic of a photodetector with a multilayer filter of the invention when used in a color discrimination system.

The photodetector of the invention can be also used in a color determination system. In this case, three photodetectors are used and these photodetectors have respective multilayer filters constructed so as to be narrow-band filters for transmitting light components of the three primary colors, blue B, green G, and red R, respectively. FIG. 17 shows the relative sensitivity characteristics of the photodetectors with such multilayer filters adapted to the three primary colors of light. In this color determination system, colors of incident light, i.e., of an object can be determined by comparing outputs of the three photodetectors.

Figure 18:
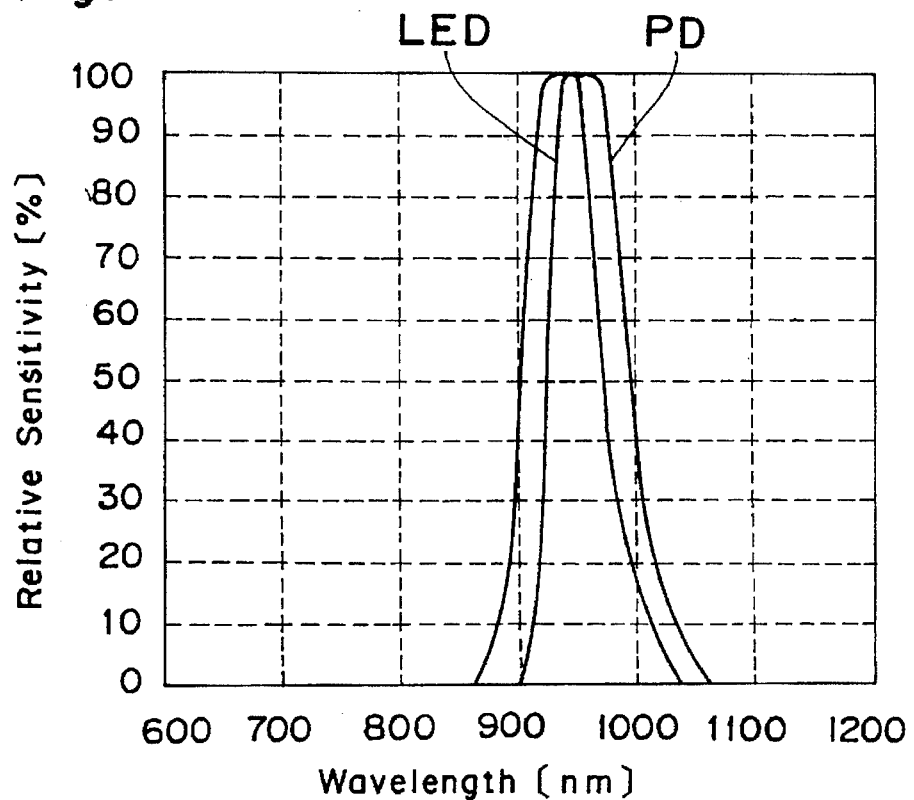
FIG. 18 is graph showing light-receiving sensitivity characteristic of a photodetector with a multilayer filter of the invention when used in an optical spatial transmission system.
Figure 20:
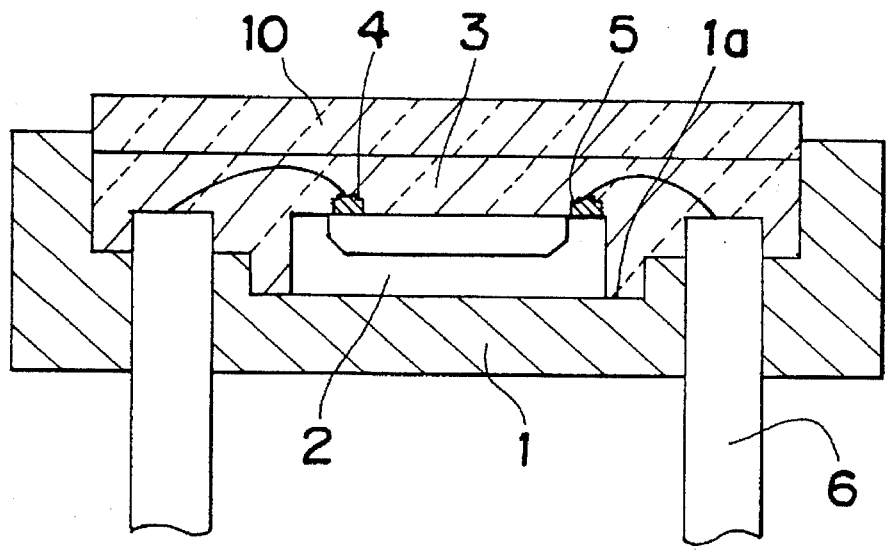
FIG. 20 is a sectional view of a conventional photodetector with a glass absorption filter.
Figure 21:
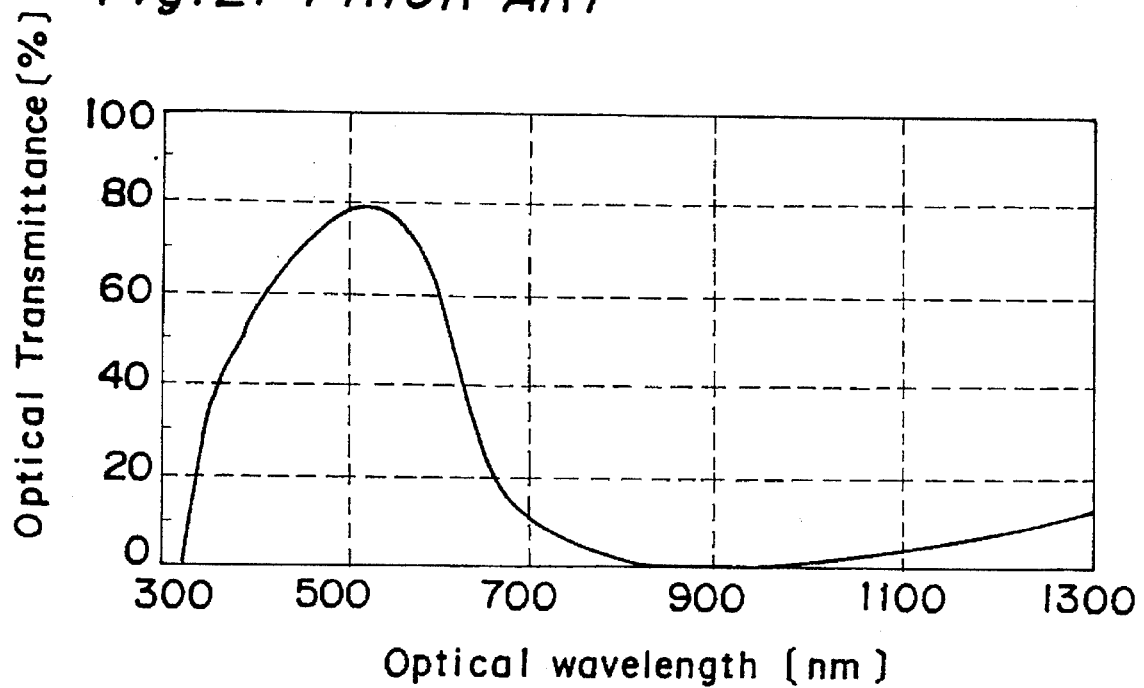
FIG. 21 is a graph showing the optical transmittance characteristic of the glass absorption filter of FIG. 20.
Figure 22:
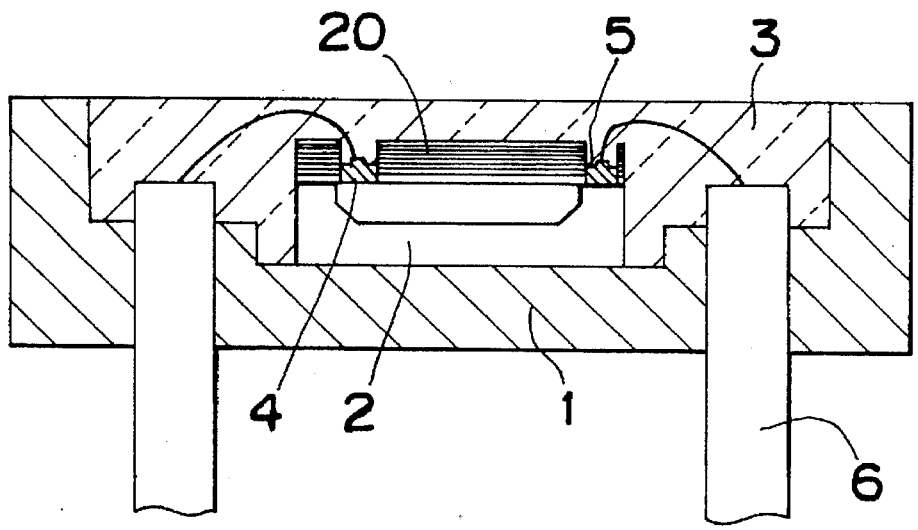
FIG. 22 is a sectional view of a photodetector with a multilayer filter.
Figure 23:
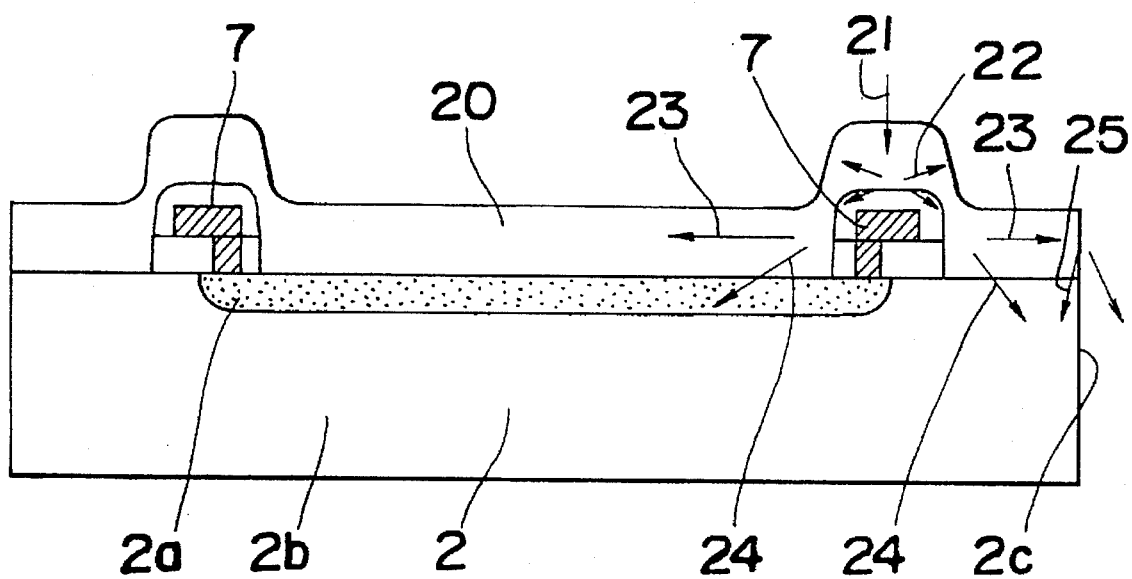
FIG. 23 is a sectional view of a light-receiving substrate of the photodetector of FIG. 22, showing scattering of light incident on an electrode.

The photodetector of the invention can be also used in an optical spatial transmission system. FIG. 18 shows light-emitting characteristic of a light-emitting diode LED on the transmission side and spectral sensitivity characteristic of the invention photodetector PD on the reception side in the optical spatial transmission system. Generally, indoor remote control systems using light-emitting diodes and photodetectors are subject to deterioration in transmission characteristic due to disturbance light derived from fluorescent lamps. When ordinary fluorescent lamps are involved, the disturbance light can be eliminated by an electric circuit after the reception of the light. However, inverter fluorescent lamps that have been increasing in number in these years would make it difficult to eliminate such disturbance light by an electric circuit, so that such light needs to be eliminated before reception. Due to this requirement, it is desirable that light-reception bands of the photodetectors should be approached to light-emitting wavelength bands of light-emitting diodes on the transmission side, so that light components in bands other than the light-emitting wavelength bands of the light-emitting diodes will not be received.

As shown in FIG. 18, the light-reception band of the photodetector PD is approached to the light-emitting wavelength band of the light-emitting diode LED on the transmission side by eliminating the visible region by the filtering effects of toner-mixed resin and the multilayer film.

Accordingly, the photodetector PD is capable of eliminating light components of wavelength bands other than light-emitting wavelength bands of the light-emitting diode LED on the transmission side and thus preventing any deterioration in transmission characteristics due to unnecessary light.

Figure 19A:
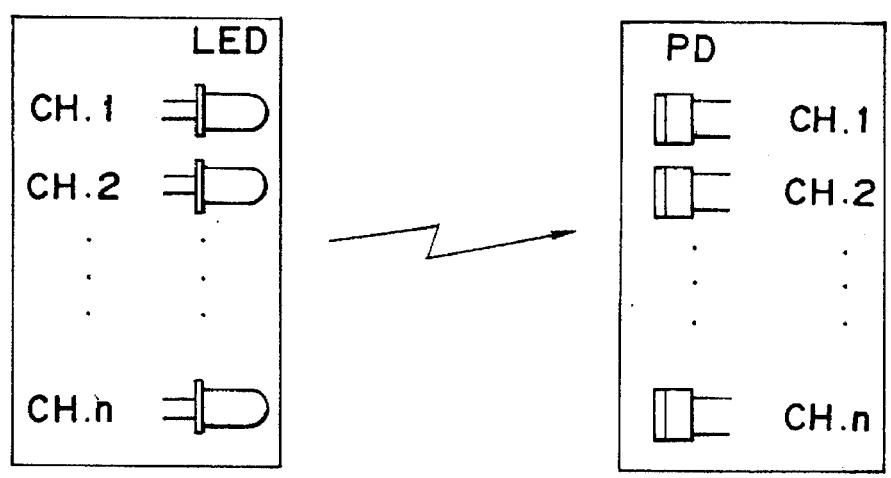
FIG. 19A illustrates part of an optical wavelength-multiplexing spatial transmission system employing the photodetector with a multilayer filter of the present invention.
Figure 19B:
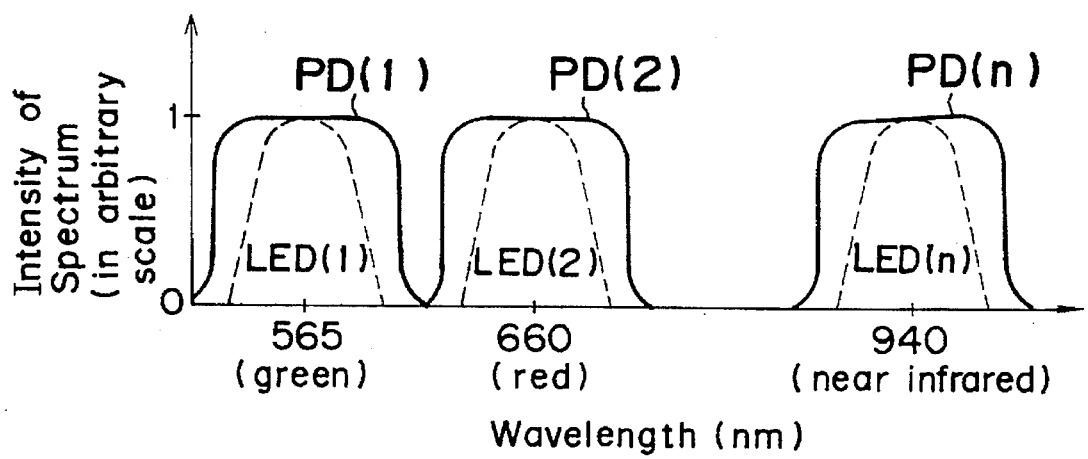
FIG. 19B is a graph showing the photo-detection sensitivity characteristic of the photodetector of FIG. 19A.

When a plurality of pairs of light-emitting diode and photodetector of different bands are used, spatial transmission of light can be carried out by the wavelength multiplexing method. FIG. 19A shows part of the arrangement of such an optical wavelength-multiplexing spatial transmission system using the invention photodetector with a multilayer filter of the present invention. In this system, as shown in FIG. 19A, a plurality of light-emitting diodes LED are assigned to channels CH.1 to CH.n on the transmission side, while photodetectors PD are assigned in correspondence to the channels CH.1 to CH.n on the reception side. As shown in 19B, the light-emitting characteristics of the light-emitting diodes LED assigned to the respective channels are set to different narrow bands, and the spectral sensitivity characteristics of the photodetectors PD corresponding to the light-emitting diodes LED are matched to the light-emitting characteristics of the respective light-emitting diodes LED.

Thus, there can be provided an optical wavelength-multiplexing spatial transmission system capable of transmitting light of a plurality of channels simultaneously while preventing any deterioration in transmission characteristics due to other-channel light and unnecessary light.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A photodetector, comprising:
    a light-receiving substrate having a light receiving portion on a top surface of the substrate and performing photoelectric conversion on light received by the light-receiving portion; and
    a multilayer filter formed on the light-receiving substrate for selectively passing light components in a predetermined wavelength band, wherein the multilayer filter comprises high refractive index films and low refractive index films, wherein the high and low refractive index films have optical film thicknesses that vary according to a plurality of different types of arithmetic series each type of arithmetic series having a common difference, the arithmetic series of one type being different in common difference from the common difference of another type.

2. The photodetector according to claim 1, wherein both the low refractive index films and the high refractive index films are amorphous.

3. The photodetector according to claim 1, wherein the high refractive index films are formed of $TiO_2$.

4. The photodetector according to claim 1, further comprising an non-transmissive film that does not pass light, the non-transmissive film being formed on the multilayer filter in regions other than a region corresponding to the light-receiving portion of the light-receiving substrate.

5. The photodetector according to claim 4, wherein the non-transmissive film is formed of a metal reflective film.

6. The photodetector according to claim 1, further comprising an opaque resin portion that covers side surfaces of the light-receiving substrate.

7. The photodetector according to claim 4, further comprising an opaque resin portion that covers side surfaces of the light-receiving substrate.

8. The photodetector according to claim 1, further comprising a metal reflective film covering side surfaces of the light-receiving substrate.

9. The photodetector according to claim 4, further comprising a metal reflective film covering side surfaces of the light-receiving substrate.

10. The photodetector according to claim 1, further comprising:
    a $P^+$ layer of a specified P-type impurity concentration that is formed in a peripheral portion of the top surface of the light-receiving substrate; and
    an $N^+$ layer of a specified N-type impurity concentration that is formed immediately inside the $P^+$ layer,
    the $P^+$ layer and $N^+$ layer constituting PN junction.

11. The photodetector according to claim 4, further comprising:
    a $P^+$ layer of a specified P-type impurity concentration that is formed in a peripheral portion of the top surface of the light-receiving substrate; and
    an $N^+$ layer of a specified N-type impurity is concentration that is formed immediately inside the $P^+$ layer,
    the $P^+$ layer and $N^+$ layer constituting PN junction.

12. The photodetector of claim 1, wherein the light-receiving substrate is entirely sealed by a transparent resin.

13. The photodetector according to claim 12, wherein an uppermost film of the multilayer filter in contact with the transparent resin is a low refractive index film.

14. The photodetector according to claim 1, wherein filter characteristic of the multilayer film is adjusted so as to have a spectral sensitivity characteristic substantially equal to a visual sensitivity.

15. The photodetector according to claim 1, wherein the high refractive index films and the low refractive index films are alternately formed.

16. The photodetector according to claim 10, wherein a metal layer is provided to short circuit the $P^+$ layer and the $N^+$ layer.

17. The photodetector according to claim 11, wherein a metal layer is provided to short circuit the $P^+$ layer and the $N^+$ layer.

18. The photodetector according to claim 1, wherein at least one of the amorphous films has been grown at a temperature below 250° C.

19. The photodetector according to claim 1, wherein the multilayer film has been patterned by wet etching.

20. The photodetector of claim 1, wherein the high refractive index films are formed of a material different from a material of the low refractive index films.

21. The photodetector of claim 1, wherein the high refractive index films and/or the low refractive index films are amorphous.

22. A method of producing a photodetector which comprises a light-receiving substrate for performing photoelectric conversion, the light receiving substrate having a light receiving portion on a top surface of the substrate, and a multilayer filter formed on the light-receiving substrate for selectively passing light components in a predetermined wavelength band, wherein the multilayer filter comprises high refractive index films and low refractive index films, wherein the high refractive index films and/or the low refractive index films are amorphous, and wherein the high and low refractive index films have optical film thicknesses that vary according to a plurality of different types of arithmetic series, each type of arithmetic series having a common difference, the arithmetic series of one type being different in common difference from the common difference of another type, comprising the steps of:

growing the high and low refractive index films on the light receiving substrate at such a temperature of the light-receiving substrate that causes the high refractive index films and/or the low refractive index films to become amorphous; and patterning the high and low refractive index films by wet etching to form the multilayer filter.

23. The method according to claim 22, wherein the high refractive films are formed of a material different from that of the low refractive films and wherein at least one of the high and low refractive films is formed at a temperature below 250° C.

24. The method according to claim 22, wherein a mixed solution of hydrofluoric acid and sulfuric acid is used as an etchant for the wet etching.

25. The method according to claim 23, wherein when the high refractive index films are formed of $TiO_2$, the temperature of the light-receiving substrate is set at 240° C. or lower.

26. A method of producing a photodetector which comprises a light-receiving substrate for performing photoelectric conversion, the light receiving substrate having a light receiving portion on a top surface of the substrate, and a multilayer filter formed on the light-receiving substrate for selectively passing light components in a predetermined wavelength band, wherein the multilayer filter comprises high refractive index films and low refractive index films, comprising the steps of:

growing a first set of high refractive index films and low refractive index films according to a first arithmetic series having a first common difference; and growing a second set of high refractive index films and low refractive index films according to a second arithmetic series having a second common difference, wherein the second common difference is different from the first common difference.

27. The method according to claim 26, wherein the high refractive index films and/or the low refractive index films are amorphous.

28. The method according to claim 26, further comprising the step of patterning the high and low refractive index films by wet etching to form the multilayer filter.

* * * * *

UNITED STATES PATENT AND TRADEMARK OFFICE
CERTIFICATE OF CORRECTION

PATENT NO. : 5,644,124
DATED : July 1, 1997
INVENTOR(S) : Toshimasa Hamada, Masaru Iwasaki, Tetsuya Hanamoto, Shohichi Katoh, Takahiro Funakoshi, Koji Miyake and Masumi Nakamichi It is certified that error appears in the above-indentified patent and that said Letters Patent is hereby corrected as shown below:

In the Abstract, line 12, please change "$SiC_2$" to -- $SiO_2$ --.

In column 1, line 16, please change "1a" -- 1$a$ --.

In column 3, line 14, please change "ones" to -- one --.

In column 3, line 25, please delete "IS".

In column 5, line 10, please change "filer" to -- filter --.

In column 6, lines 13 and 16, please change "illustrates" to -- illustrate --.

In column 7, line 20, please change "4, respectively" to -- 4, 5, respectively --.

In column 8, line 64, please change "corresponding the" to -- corresponding to the --.

In column 10, line 25, please change "film is" to -- film, is --.

In column 11, lines 43 and 48, please change "FIG" to -- FIGS --.

In column 12, line 16, please change "are" to -- is --.

In column 12, line 27, please change "is possibility" to -- is a possibility --.

UNITED STATES PATENT AND TRADEMARK OFFICE
CERTIFICATE OF CORRECTION

PATENT NO. : 5,644,124

DATED : July 1, 1997

INVENTOR(S) : Toshimasa Hamada et al.

It is certified that error appears in the above-identified patent and that said Letters Patent is hereby corrected as shown below:

Column 12, line 32, please change "FIG. 1, same" to --FIG. 1, the same--.

Column 13, line 10, please change "methods whereby" to --method, whereby--.

Column 13, line 43, please change "an type" to --an N type--.

Column 14, line 11, please change "effect," to --effect.--.

Column 14, line 54, please change "object can" to --object, can--.

Column 16, line 7, please change "an" to --a--.

Column 16, line 39, please delete "is".

Signed and Sealed this

Twenty-first Day of July, 1998

Attest:

BRUCE LEHMAN

Attesting Officer

Commissioner of Patents and Trademarks